(12) United States Patent
Choi et al.

(10) Patent No.: US 12,185,004 B2
(45) Date of Patent: Dec. 31, 2024

(54) IMAGE SENSOR

(71) Applicant: SAMSUNG ELECTRONICS CO., LTD., Suwon-si (KR)

(72) Inventors: Minjun Choi, Hwaseong-si (KR); Myunglae Chu, Hwaseong-si (KR); Seoksan Kim, Suwon-si (KR); Minwoong Seo, Hwaseong-si (KR); Jiyoun Song, Seoul (KR); Hyunyong Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 18/046,526

(22) Filed: Oct. 14, 2022

(65) Prior Publication Data

US 2023/0122582 A1 Apr. 20, 2023

(30) Foreign Application Priority Data

Oct. 15, 2021 (KR) .................. 10-2021-0137636

(51) Int. Cl.
*H04N 25/75* (2023.01)
*H04N 25/766* (2023.01)
*H04N 25/772* (2023.01)
*H10K 39/32* (2023.01)

(52) U.S. Cl.
CPC .......... *H04N 25/75* (2023.01); *H04N 25/766* (2023.01); *H04N 25/772* (2023.01); *H10K 39/32* (2023.02)

(58) Field of Classification Search
CPC .... H04N 25/75; H04N 25/772; H04N 25/766; H10K 39/32
See application file for complete search history.

(56) References Cited

U.S. PATENT DOCUMENTS

| 9,748,288 | B2 | 8/2017 | Baek |
| 10,355,051 | B2 | 7/2019 | Keel et al. |
| 10,522,581 | B2 | 12/2019 | Lee et al. |
| 10,573,681 | B2 | 2/2020 | Kanto et al. |

(Continued)

FOREIGN PATENT DOCUMENTS

| KR | 10-2016-0100569 | 8/2016 |
| KR | 10-2018-0015378 | 2/2018 |

(Continued)

*Primary Examiner* — Twyler L Haskins
*Assistant Examiner* — Fayez A Bhuiyan
(74) *Attorney, Agent, or Firm* — F. Chau & Associates, LLC

(57) ABSTRACT

An image sensor includes a pixel array in which a plurality of pixels are arranged. Each of the plurality of pixels includes an organic photodiode of which a sensitivity is adjusted based on an external voltage, a silicon photodiode, first and second floating diffusion nodes, a conversion gain transistor, and a driving transistor. Charges generated by the silicon photodiode are accumulated in the first floating diffusion node. Charges generated by the organic photodiode are accumulated in the second floating diffusion node. One end of the conversion gain transistor is connected to the first floating diffusion node and the other end connected is connected to the second floating diffusion node. The driving transistor is configured to generate a pixel signal corresponding to a voltage of the first floating diffusion node.

20 Claims, 14 Drawing Sheets

(56) References Cited

U.S. PATENT DOCUMENTS

| | | | |
|---|---|---|---|
| 10,791,292 | B1 | 9/2020 | Geurts |
| 11,043,538 | B2 | 6/2021 | Choi et al. |
| 2014/0375826 | A1* | 12/2014 | Lee ................. H04N 25/13 257/40 |
| 2015/0372036 | A1 | 12/2015 | Suh et al. |
| 2018/0158856 | A1 | 6/2018 | Han et al. |
| 2019/0131349 | A1 | 5/2019 | Im et al. |
| 2019/0229138 | A1 | 7/2019 | Lee et al. |
| 2019/0267429 | A1* | 8/2019 | Zhang ................ H10K 30/81 |
| 2020/0077077 | A1 | 3/2020 | Watanabe |
| 2021/0152790 | A1 | 5/2021 | Sugizaki |

FOREIGN PATENT DOCUMENTS

| | | |
|---|---|---|
| KR | 10-2018-0060309 | 6/2018 |
| KR | 10-2019-0138199 | 12/2019 |

* cited by examiner

IMAGE SENSOR

CROSS-REFERENCE TO RELATED APPLICATION

This application claims priority under 35 U.S.C. § 119 to Korean Patent Application No. 10-2021-0137636, filed on Oct. 15, 2021 in the Korean Intellectual Property Office, the disclosure of which is incorporated by reference herein in its entirety.

TECHNICAL FIELD

Example embodiments of the inventive concept relate to an image sensor, and more particularly, to an image sensor configured to generate image data by using an organic photodiode.

DISCUSSION OF RELATED ART

An image sensor is a device for capturing a two-dimensional or three-dimensional image of an object. The image sensor generates an image of an object by using a photoelectric conversion element that responds according to the intensity of light reflected from the object. Recently, with the development of complementary metal-oxide semiconductor (CMOS) technology, CMOS image sensors using CMOS have been widely used.

SUMMARY

Example embodiments of the inventive concept provide an image sensor capable of efficiently adjusting the sensitivity of photodiodes therein by using an organic photodiode and a silicon photodiode and including pixels implementing a wide dynamic range.

According to an example embodiment of the inventive concept, there is provided an image sensor including a pixel array including a plurality of pixels, wherein each of the plurality of pixels includes an organic photodiode of which a sensitivity is adjusted based on an external voltage; a silicon photodiode; a first floating diffusion node in which charges generated by the silicon photodiode are accumulated; a second floating diffusion node in which charges generated by the organic photodiode are accumulated; a conversion gain transistor having one end connected to the first floating diffusion node and another end connected to the second floating diffusion node; and a driving transistor configured to generate a pixel signal corresponding to a voltage of the first floating diffusion node.

According to an example embodiment of the inventive concept, there is provided an image sensor including a pixel array in which a plurality of pixels are arranged, wherein each of the plurality of pixels includes: an organic photodiode of which a sensitivity is adjusted based on an external voltage; a silicon photodiode; a first floating diffusion node in which charges generated by the silicon photodiode are accumulated; a second floating diffusion node in which charges generated by the organic photodiode are accumulated; an organic reset transistor configured to reset the second floating diffusion node based on a reset voltage applied from outside a pixel; a silicon transfer transistor configured to transfer charges generated by the silicon photodiode to the first floating diffusion node; an organic transfer transistor configured to transfer charges generated by the organic photodiode to the second floating diffusion node; and a driving transistor configured to generate a pixel signal corresponding to a voltage of the first floating diffusion node.

According to an example embodiment of the inventive concept, there is provided an image sensor including a pixel array in which a plurality of pixels are arranged, wherein each of the plurality of pixels includes: an organic photodiode of which a sensitivity is adjusted based on an external voltage; a silicon photodiode; a first floating diffusion node in which charges generated by the silicon photodiode are accumulated; a second floating diffusion node in which charges generated by the organic photodiode are accumulated; an organic reset transistor configured to reset the second floating diffusion node based on a reset voltage applied from outside a pixel; a silicon transfer transistor configured to transfer charges generated by the silicon photodiode to the first floating diffusion node; a silicon reset transistor configured to reset the first floating diffusion node based on the reset voltage; and a driving transistor configured to generate a pixel signal corresponding to a voltage of the first floating diffusion node.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1A:
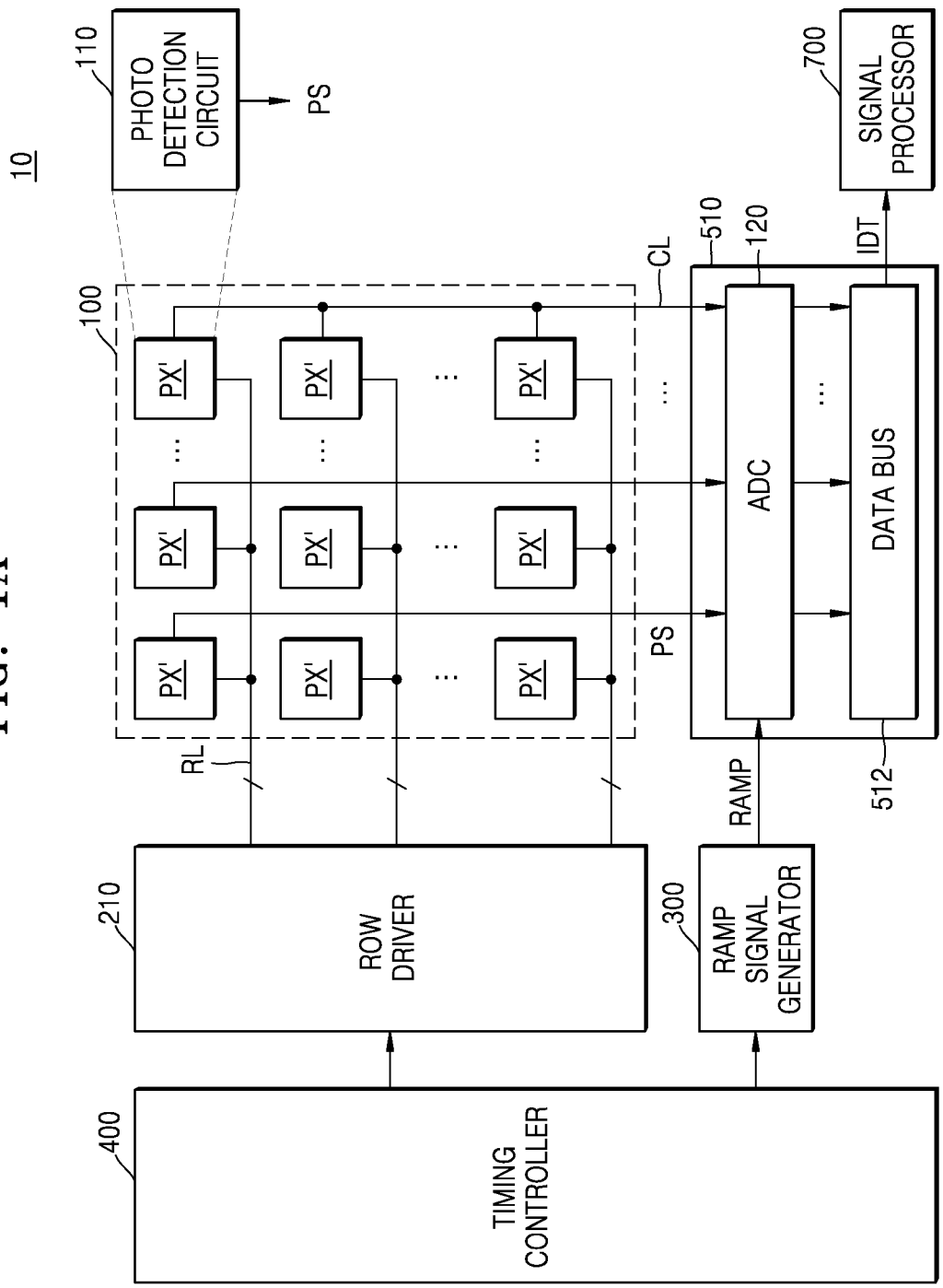
FIGS. 1A and 1B are block diagrams illustrating an image sensor according to an example embodiment of the inventive concept.

Example embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to example embodiments, the parameter may be exactly the certain value or approximately the certain value within a measurement error as would be understood by a person having ordinary skill in the art.

Figure 1B:
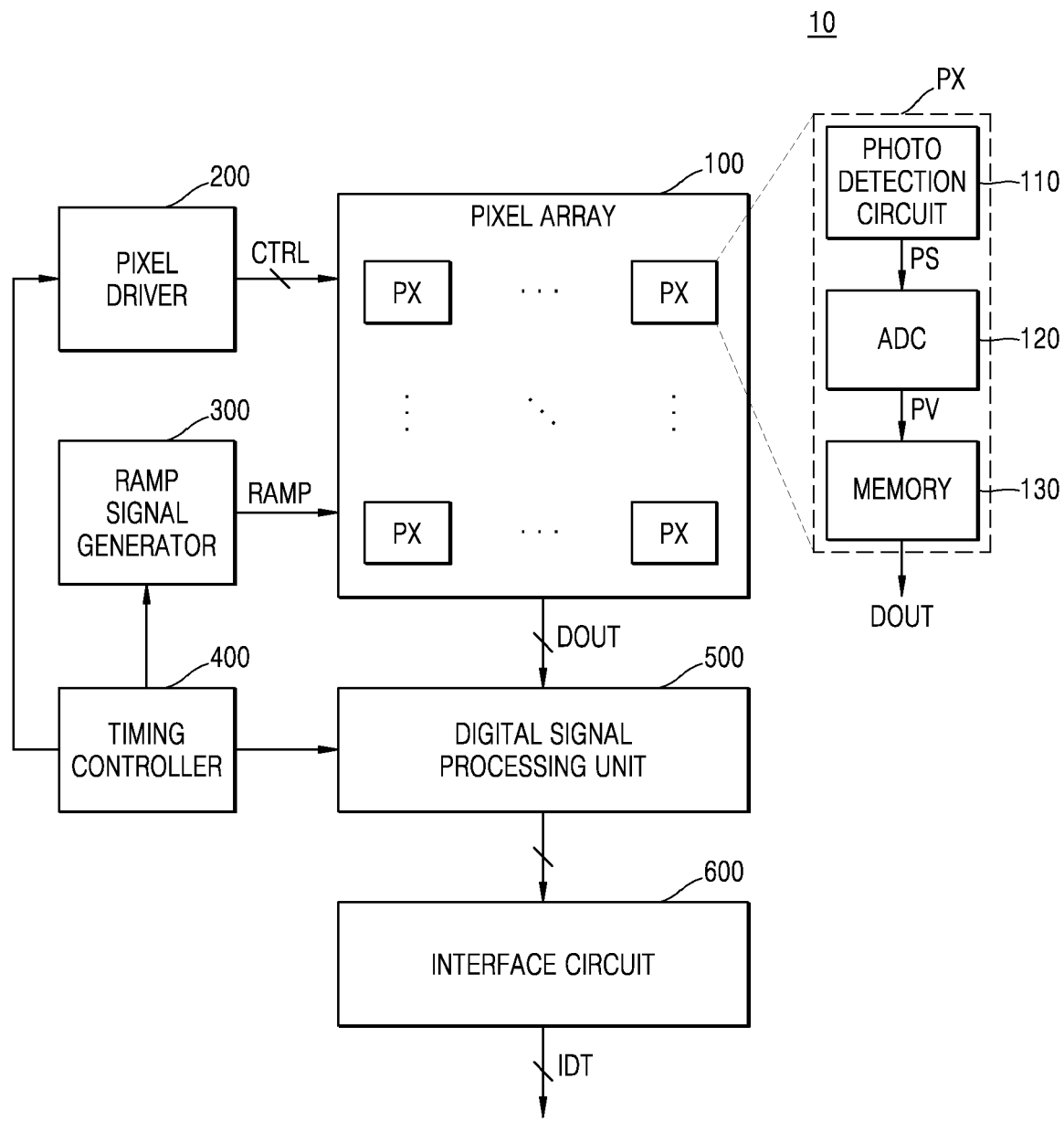

FIGS. 1A and 1B are block diagrams illustrating an image sensor 10 according to an example embodiment of the inventive concept.

The image sensor 10 may be mounted in an electronic device having an image or light sensing function. For example, the image sensor 10 may be mounted in an electronic device such as a camera, a smartphone, a wearable device, an Internet of Things (IoT) device, a tablet personal computer (PC), a personal digital assistant (PDA), a portable multimedia player (PMP), a navigation device, etc. In addition, the image sensor 10 may be mounted in an electronic device provided as a component in, for example, a vehicle, furniture, manufacturing equipment, a door, various measurement devices, etc.

Referring to FIG. 1A, the image sensor 10 may include a pixel array 100, a row driver 210, a readout circuit 510, a ramp signal generator 300, a timing controller 400, and a signal processor 700. The readout circuit 510 may include an analog-to-digital converter (ADC) 120 and a data bus 512.

The pixel array 100 may include a plurality of row lines RL, a plurality of column lines CL, and a plurality of pixels PX'. The pixels PX' are connected to the plurality of row lines RL and the plurality of column lines CL and are arranged in a matrix. Each pixel PX' may sense light by using a photoelectric conversion element, and may output a pixel signal that is an electrical signal according to the sensed light. For example, the photoelectric conversion element may be a photo-sensing element including an organic material or an inorganic material, such as an inorganic photodiode, an organic photodiode, a perovskite photodiode, a phototransistor, a photogate or a pinned photodiode.

In an example embodiment, each of the plurality of pixels PX' may include a photo detection circuit 110. The photo detection circuit 110 may include a plurality of photoelectric conversion elements. The photo detection circuit 110 may detect light by using a photoelectric conversion element and may output a pixel signal PS, which is an electrical signal, according to the sensed light. In an example embodiment, each of the plurality of pixels PX' may include a plurality of photoelectric conversion elements.

The plurality of photoelectric conversion elements included in the photo detection circuit 110 may be implemented as different types of photoelectric conversion elements. In an example embodiment, one of the plurality of photoelectric conversion elements may be an organic photodiode, and the other one may be a silicon photodiode.

The photo detection circuit 110 may detect a light signal by using a photoelectric conversion element and convert the light signal into the pixel signal PS, which is an electrical signal. A micro lens for light collection may be disposed on an upper portion of each of the plurality of pixels PX' or on an upper portion of each of pixel groups including the adjacent pixels PX'. Each of the plurality of pixels PX' may sense light in a specific spectrum region from light received through the micro lens. For example, the plurality of pixels PX' may include a red pixel converting light in a red spectrum region into an electrical signal, a green pixel converting light in a green spectrum region into an electrical signal, and a blue pixel converting light in a blue spectrum region into an electrical signal. A color filter for transmitting light in a specific spectrum region may be disposed on an upper portion of each of the plurality of pixels PX'. However, example embodiments of the inventive concept are not limited thereto. For example, according to example embodiments, the pixel array 100 may include pixels that convert light in a spectrum region other than red, green, and blue into an electric signal.

A color filter array for transmitting light in a specific spectrum region may be disposed on an upper portion of each of the plurality of pixels PX', and a color detectable by the corresponding pixel may be determined according to the color filter disposed on the upper portion of each of the plurality of pixels PX'. However, embodiments of the inventive concept are not limited thereto. For example, according to example embodiments, a specific photoelectric conversion element may also convert light of a specific wavelength band into an electrical signal according to the level of an electrical signal applied to the photoelectric conversion element.

In some example embodiments, the photo detection circuit 110 may include at least two or more photodiodes configured to be exposed to a light source. For example, the pixel PX' may include an organic photodiode (OPD in FIGS. 2 and 5) of which a sensitivity is adjusted based on an external voltage and a silicon photodiode (SPD in FIGS. 2 and 5) having a higher sensitivity than that of the organic photodiode. As such, a structure in which the organic photodiode OPD and the silicon photodiode SPD having different sensitivities are included in one pixel PX' may be referred to as a split photodiode structure. However, embodiments of the inventive concept are not limited thereto. A detailed configuration of the photo detection circuit 110 according to an example embodiment will be described in detail with reference to FIG. 2.

The silicon photodiode SPD may have a higher sensitivity than that of the organic photodiode OPD. Due to such characteristics, the silicon photodiode SPD may generate the pixel signal PS corresponding to low illuminance, and the organic photodiode OPD may generate the pixel signal PS corresponding to high luminance. Hereinafter, for convenience of description, it may be assumed that the pixel PX' includes the silicon photodiode SPD and the organic photodiode OPD. However, example embodiments of the inventive concept are not limited thereto. For example, according to example embodiments, the pixel PX' may include a plurality of photodiodes having the same or different light receiving areas.

In the photo detection circuit 110, charges generated by the photodiode may be accumulated in a floating diffusion node, and the charges accumulated in the floating diffusion node may be converted into voltages. In this regard, a rate at which the charges accumulated in the floating diffusion node are converted into voltages may be referred to as a conversion gain.

In some example embodiments, each of the plurality of pixels PX' may operate with a dual conversion gain. The dual conversion gain includes a low conversion gain (LCG) and a high conversion gain (HCG). Because the HCG has a higher rate at which charges are converted into voltages, the HCG may be applied to an operation of generating the pixel signal PS corresponding to a lower illuminance than that of the LCG. Hereinafter, for convenience of description, an operation mode in which the pixel signal PS is generated by using the HCG is referred to as an HCG mode, and an operation mode in which the pixel signal PS is generated by using the LCG is referred to as an LCG mode.

In some example embodiments, each of the silicon photodiode SPD and the organic photodiode OPD may generate the pixel signals PS in a dual conversion gain mode. For example, the silicon photodiode SPD may operate in the HCG mode to generate a first pixel signal in a first illuminance range. However, embodiments of the inventive concept are not limited thereto. For example, according to example embodiments, the silicon photodiode SPD may operate in the LCG mode. In addition, the organic photodiode OPD may operate in the LCG mode to generate a second pixel signal in a second illuminance range that is at least partially equal to or greater than the first illuminance range. In addition, the first pixel signal and the second pixel signal may be generated within one frame period in which the pixel array 100 is scanned.

The first pixel signal and the second pixel signal generated through the silicon photodiode SPD and the organic photodiode OPD may be synthesized into one image, and the synthesized image may have a high dynamic range.

In some example embodiments, each of the plurality of pixels PX' may operate in a single exposure method in which an exposure operation is performed once or in a multiple exposure method in which an exposure operation is performed multiple times. For example, the pixel PX' may operate in the single exposure method in which the pixel signals PS are generated through the silicon photodiode SPD and/or the organic photodiode OPD after the exposure operation is performed once. As another example, the pixel PX' may operate in the multiple exposure method in which the pixel signal PS is generated through the silicon photodiode SPD and/or the organic photodiode OPD in response to a first exposure operation, and then, the pixel signal PS is additionally generated through the silicon photodiode SPD and/or the organic photodiode OPD in response to a second exposure operation.

The row driver 210 may drive the pixel array 100 in units of rows. The row driver 210 may decode a row control signal (e.g., an address signal) received from the timing controller 400, and select at least any one row line from among row lines included in the pixel array 100, in response to the decoded row control signal. For example, the row driver 210 may generate a selection signal selecting one of a plurality of rows. In addition, the pixel array 100 may output a pixel signal from a row selected by the selection signal provided from the row driver 210.

The row driver 210 may transmit control signals for outputting the pixel signal PS to the pixel array 100, and the pixel PX' may operate in response to the control signals, thereby outputting the pixel signal PS.

The timing controller 400 may control overall operations of the image sensor 10. For example, the row driver 210 and the ramp signal generator 300 may generate a selection signal and a ramp signal RAMP based on timing signals provided from the timing controller 400.

The ramp signal generator 300 may generate and output the ramp signal RAMP to the readout circuit 510. The ramp signal RAMP may be provided to the ADC 120 of the readout circuit 510 and may be used as a reference signal to be compared with the pixel signal PS. In an example embodiment, the ramp signal RAMP may be a constantly decreasing or increasing signal (e.g., an increasing/decreasing signal having a single inclination).

The readout circuit 510 may read out the pixel signal PS from the pixels PX' in a row selected by the row driver 210 among the plurality of pixels PX'. In this case, the pixel signal PS may include a reset signal or an image signal (or a sensing signal). The readout circuit 510 may convert reset signals and image signals received from the pixel array 100 through the plurality of column lines CL into digital data based on the ramp signal RAMP received from the ramp signal generator 300, thereby generating and outputting pixel values corresponding to the plurality of pixels PX' in units of rows.

The readout circuit 510 may include a plurality of ADCs 120 corresponding to the plurality of column lines CL. Each of the plurality of ADCs may compare each of reset signals and image signals received through the corresponding column line CL with the ramp signal RAMP, and generate a pixel value based on the comparison results. For example, the ADC 120 may remove the reset signal from the image signal and generate a pixel value representing the amount of light sensed by the pixel PX'.

The readout circuit 510 may include a plurality of correlated double sampling (CDS) circuits and a plurality of counter circuits. The readout circuit 510 may convert the pixel signal PS input from the pixel array 100 into a pixel value that is a digital signal. Each pixel signal PS received through each of the plurality of column lines CL may be converted into a pixel value that is a digital signal by a CDS circuit and a counter circuit.

The CDS circuit may compare the pixel signal PS received through the column line CL with the ramp signal RAMP and output a comparison result. The CDS circuit may output a comparison signal transitioning from a logic high level to a logic low level when a level of the ramp signal RAMP and a level of the pixel signal are the same. A timing at which the level of the comparison signal transitions may be determined according to the level of the pixel signal PS.

The CDS circuit may sample and hold the pixel signal PS provided from the pixel PX' according to a CDS method, double sample a level of specific noise (e.g., a reset signal) and a level according to the image signal, and generate a comparison signal based on a level corresponding to a difference between the double sample.

In some example embodiments, the CDS circuit may include one or more comparators. The comparator may be implemented as, for example, an operational transconductance amplifier (OTA) (or a differential amplifier).

A plurality of pixel values generated by the ADC 120 may be output as image data IDT through the data bus 512. For example, the image data IDT may be provided to an image signal processor 700 inside or outside of the image sensor 10.

The data bus 512 may temporarily store the pixel value output from the ADC 120 and then output the pixel value. The data bus 512 may include a plurality of column memories and a column decoder. The plurality of pixel values stored in the plurality of column memories may be output as the image data IDT under the control of the column decoder.

The signal processor 700 may perform, for example, noise reduction processing, gain adjustment, waveform shaping processing, interpolation processing, white balance processing, gamma processing, edge enhancement processing, binning, etc. on the image data IDT. In some example embodiments, as the pixel array 100 operates in the HCG mode of the silicon photodiode SPD and the LCG mode of the organic photodiode OPD in one frame period, the signal processor 700 may receive the pixel signals PS corresponding to the above-described modes from the data bus 132, and merge the received pixel signals PS to generate an image having a high dynamic range. In an example embodiment, the signal processor 700 may be provided in an external processor of the image sensor 10.

Referring to FIG. 1B, the image sensor 10 may include the pixel array 100, a pixel driver 200, the ramp signal generator 300, the timing controller 400, a digital signal processing unit 500 and an interface circuit 600. The pixel array 100 may include a plurality of pixels PX. Each of the plurality of pixels PX may be configured to sense a light signal from outside of the image sensor 10 and output a digital output signal DOUT corresponding to the sensed light signal. For convenience of explanation, redundant descriptions between the pixel PX' of FIG. 1A and the pixel PX of FIG. 1B will be omitted, and redundant descriptions between FIG. 1A and FIG. 1B will be omitted.

Each of the plurality of pixels PX may include the photo detection circuit 110, the ADC 120, and a memory 130. In FIG. 1A, the ADC 120 may be included outside of the pixel PX, while the pixel PX of FIG. 1B may include the ADC 120 as a digital pixel. The photo detection circuit 110 may include a photoelectric conversion element, and may convert a light signal sensed from outside of the image sensor 10 into an electrical signal, that is, the pixel signal PS, which is an analog signal. The pixel signal PS may include a reset signal according to a reset operation of the pixel PX, and may include an image signal according to a light sensing operation of the pixel PX.

The ADC 120 may convert the pixel signal PS output from the photo detection circuit 110 into a pixel value PV that is a digital signal, and the memory 130 may store the converted pixel value PV. The memory 130 may output a digital output signal DOUT under the control of the pixel driver 200. The ADC 120 may compare the pixel signal PS with the ramp signal RAMP, thereby converting the pixel signal PS into a digital signal. The ADC 120 may compare each of a reset signal and an image signal received from the photo detection circuit 110 with the ramp signal RAMP, and generate the pixel value PV, which is a digital signal, based on the comparison results.

The pixel driver 200 may output control signals CTRL for controlling the plurality of pixels PX included in the pixel array 100. In response to the control signals CTRL generated from the pixel driver 200, each of the plurality of pixels PX may generate the pixel signal PS, convert the pixel signal PS into the pixel value PV, which is a digital signal, by using the ramp signal RAMP, store the pixel value PV, and output the stored pixel value PV as the digital output signal DOUT. Also, an operation mode of each of the plurality of pixels PX may be changed in response to the control signals CTRL generated from the pixel driver 200.

The ramp signal generator 300 may generate the ramp signal RAMP and output the ramp signal RAMP to the pixel array 100. The ramp signal RAMP may be provided to the ADC 120 of the pixel PX and may be used as a reference signal to be compared with the pixel signal PS.

The timing controller 400 may control overall operations of the image sensor 10. The pixel driver 200 and the ramp signal generator 300 may generate the control signal CTRL and the ramp signal RAMP based on timing signals provided from the timing controller 400.

The digital signal processing unit 500 may perform digital signal processing on the digital output signals DOUT received from the pixel array 100 to provide the image data IDT to an external device. The digital output signal DOUT may include a reset value according to a reset operation of the pixel PX, and may include an image signal value according to a light sensing operation of the pixel PX. The digital signal processing unit 500 may perform an operation on the reset value and the image signal value, thereby determining a final digital value corresponding to the light signal sensed by one pixel PX. The image data IDT may be generated by combining final digital values determined from each of the plurality of pixels PX. That is, the CDS operation may be implemented through the digital output signal DOUT generated by the operation of the ADC 120 included in the pixel PX and a digital signal processing operation of the digital signal processing unit 500.

The interface circuit 600 may be configured to receive control information from an external device or output the image data IDT. In an example embodiment, the interface circuit 600 may exchange information described above with an external device based on a predetermined protocol.

The signal processor (e.g., the signal processor 700 of FIG. 1A) may be included in the image sensor 10 or may be included in an external processor of the image sensor 10.

Figure 2:
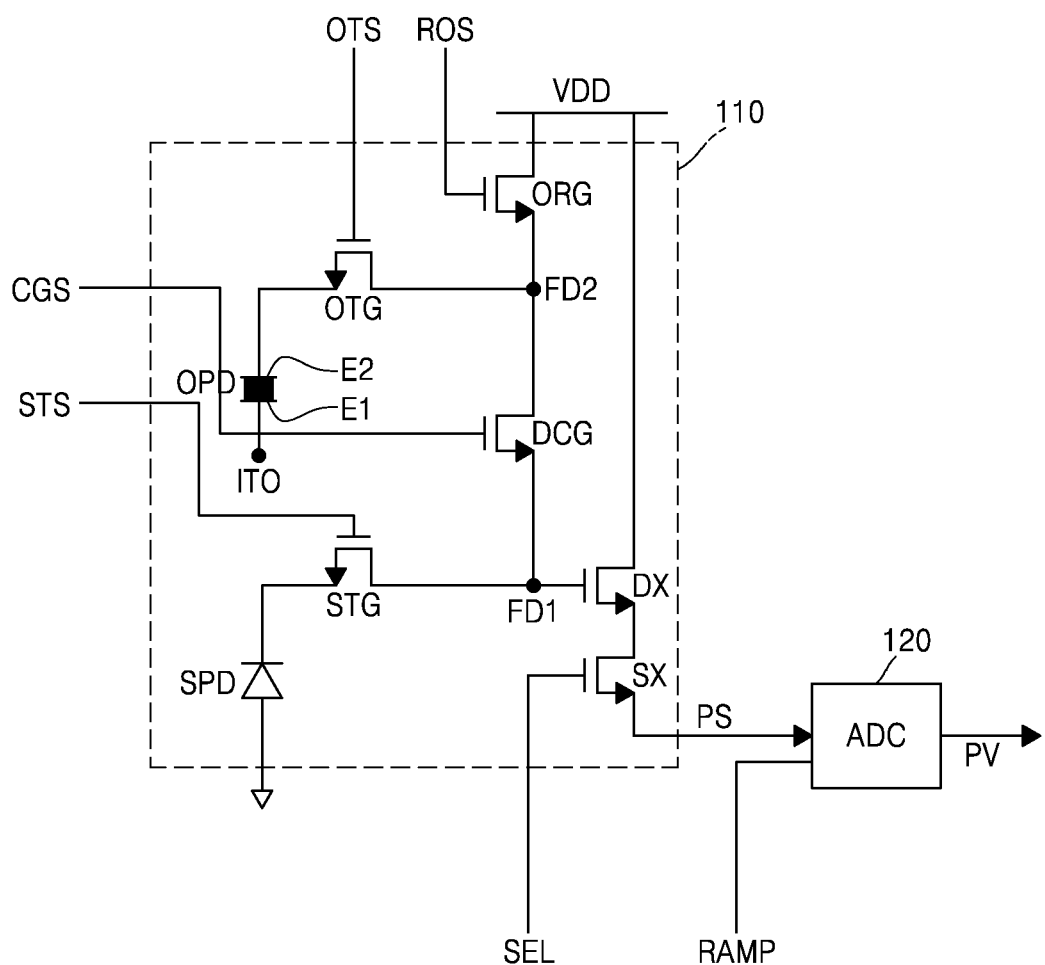
FIG. 2 is a diagram illustrating a part of a pixel according to an example embodiment of the inventive concept.

FIG. 2 is a diagram illustrating a part of the pixel PX according to an example embodiment of the inventive concept.

Referring to FIGS. 1B and 2, the pixel PX may include the photo detection circuit 110 and the ADC 120. FIG. 2 illustrates that the ADC 120 is included in the pixel PX. However, embodiments of the inventive concept are not limited thereto. For example, according to example embodiments, the ADC 120 may be included outside of the pixel PX as shown in FIG. 1A. The photo detection circuit 110 may be included in the pixel PX of FIGS. 1A and 1B. Accordingly, the description of the photo detection circuit 110 of the pixel PX of FIG. 2 may also be applied to the photo detection circuit 111 of the pixel PX' of FIG. 1A.

The photo detection circuit 110 may include a plurality of photodiodes, for example, the organic photodiode OPD and the silicon photodiode SPD. The photo detection circuit 110 may include a plurality of transistors, for example, an organic transfer transistor OTG, a silicon transfer transistor STG, an organic reset transistor ORG, a driving transistor DX, a selection transistor SX, and a conversion gain transistor DCG. Control signals ROS, OTS, CGS, STS, and SEL may be applied to the pixel PX. At least some of the control signals ROS, OTS, CGS, STS, and SEL may be generated by the pixel driver 200.

The silicon photodiode SPD and the organic photodiode OPD may generate photo charges that vary according to the intensity of light. For example, the silicon photodiode SPD and the organic photodiode OPD may generate charges, e.g., electrons which are negative charges and holes which are positive charges, in proportion to the amount of incident light. The photo charges generated by the silicon photodiode SPD and the organic photodiode OPD may be transferred to and accumulated in at least one of floating diffusion nodes FD1 and FD2. A parasitic capacitor may be formed in, or an actual capacitor element may be connected to, each of the floating diffusion nodes FD1 and FD2.

The organic photodiode OPD may include a first electrode E1 and a second electrode E2. The organic photodiode OPD may include an organic photoconductive film (OPF). An external voltage ITO may be applied to the first electrode E1 of the organic photodiode OPD, and the second electrode E2 may be connected to the organic transfer transistor OTG. The external voltage ITO may be equally applied to the plurality of pixels PX of the pixel array 100. The sensitivity of the organic photodiode OPD may be adjusted based on the external voltage ITO. For example, as the external voltage ITO applied to the organic photodiode OPD decreases, the sensitivity of the organic photodiode OPD may decrease.

The sensitivity of the silicon photodiode SPD may be set to be higher than that of the organic photodiode OPD. A light receiving area of the silicon photodiode SPD may be greater than or about equal to a light receiving area of the organic photodiode OPD, and the sensitivity thereof may be higher than that of the organic photodiode OPD.

The photo detection circuit 110 may include the silicon transfer transistor STG. The silicon transfer transistor STG may be connected between the silicon photodiode SPD and the first floating diffusion node FD1. A first terminal of the silicon transfer transistor STG may be connected to an output terminal of the silicon photodiode SPD, and a second terminal of the silicon transfer transistor STG may be connected to the first floating diffusion node FD1. The silicon transfer transistor STG may be turned on or turned off in response to a silicon transfer control signal STS received from the pixel driver 200, and transmit photocharges generated by the silicon photodiode SPD to the first floating diffusion node FD1.

The photo detection circuit 110 may include the conversion gain transistor DCG. A first terminal of the conversion gain transistor DCG may be connected to the first floating diffusion node FD1, and a second terminal thereof may be connected to the second floating diffusion node FD2. The conversion gain transistor DCG may be turned on or turned off in response to the gain control signal CGS received from the pixel driver 200, and the floating diffusion nodes FD1 and FD2 may be connected to each other.

When the conversion gain transistor DCG is turned on, the first floating diffusion node FD1 and the second floating diffusion node FD2 may be connected to each other so that a conversion gain may decrease. When the conversion gain transistor DCG is turned off, the conversion gain transistor DCG may operate in an HCG mode.

The photo detection circuit 110 may include the organic transfer transistor OTG. The organic transfer transistor OTG may be connected between the organic photodiode OPD and the second floating diffusion node FD2. A first terminal of the organic transfer transistor OTG may be connected to the second electrode E2 of the organic photodiode OPD, and a second terminal thereof may be connected to the second floating diffusion node FD2. The organic transfer transistor OTG may be turned on or turned off in response to an organic transfer control signal OTS received from the pixel driver 200, and transmit photocharges generated by the organic photodiode OPD to the second floating diffusion node FD2.

The photo detection circuit 110 may include the organic reset transistor ORG. The organic reset transistor ORG may reset charges accumulated in at least one of the floating diffusion nodes FD1 and FD2. A reset voltage (e.g., pixel voltage VDD) may be applied to a first terminal of the organic reset transistor ORG, and a second terminal of the organic reset transistor ORG may be connected to the second floating diffusion node FD2. Embodiments of the inventive concept are not limited thereto, and a voltage other than the pixel voltage VDD may be applied to the first terminal. The organic reset transistor ORG may be turned on or off in response to the organic reset control signal ROS received from the pixel driver 200, and charges accumulated in the second floating diffusion node FD2 may be discharged so that the second floating diffusion node FD2 may be reset.

The photo detection circuit 110 may include the driving transistor DX. A first terminal of the driving transistor DX may be connected to the selection transistor SX, and a driving voltage (e.g., a pixel voltage VDD) may be applied to a second terminal of the driving transistor DX. The driving transistor DX may operate as a source follower and may generate a pixel signal corresponding to a voltage of at least one of the floating diffusion nodes FD1 and FD2. For example, the driving transistor DX may generate a pixel signal corresponding to the voltage of the first floating diffusion node FD1.

The photo detection circuit 110 may include the selection transistor SX. A first terminal of the selection transistor SX may be connected to the driving transistor DX, and a second terminal of the selection transistor SX may be connected to the ADC 120. The selection transistor SX may be turned on or off in response to a selection signal SEL received from the pixel driver 200. When the selection transistor SX is turned on in a readout operation, the pixel signal PS including a reset signal corresponding to a reset operation or an image signal corresponding to a charge accumulation operation may be output to the ADC 120.

According to an example embodiment of the inventive concept, the silicon photodiode SPD may generate the pixel signals PS corresponding to a dual conversion gain through the conversion gain transistor DCG. For example, the conversion gain transistor DCG may be turned on or off according to the gain control signal CGS transitioned to an active level or an inactive level corresponding to a specific conversion gain mode, so that the silicon photodiode SPD may generate the pixel signals PS corresponding to the dual conversion gain.

For example, when the silicon photodiode SPD operates in an LCG mode during a readout period, the gain control signal CGS may have an active level. Accordingly, the conversion gain transistor DCG may be turned on, and the second floating diffusion node FD2 may be connected to the first floating diffusion node FD1.

Also, when the silicon photodiode SPD operates in the HCG mode during the readout period, the gain control signal CGS may have an inactive level. Accordingly, in an example embodiment, the conversion gain transistor DCG may be turned off, and the second floating diffusion node FD2 is not connected to the first floating diffusion node FD1.

The pixel PX may include the ADC 120. The ADC 120 may compare the pixel signal PS with the ramp signal RAMP, thereby converting the pixel signal PS into the pixel value PV, which is a digital signal. For example, the ADC 120 may generate the pixel value PV based on a comparison result of comparing the ramp signal RAMP having a falling inclination and the pixel signal PS.

Figure 3:
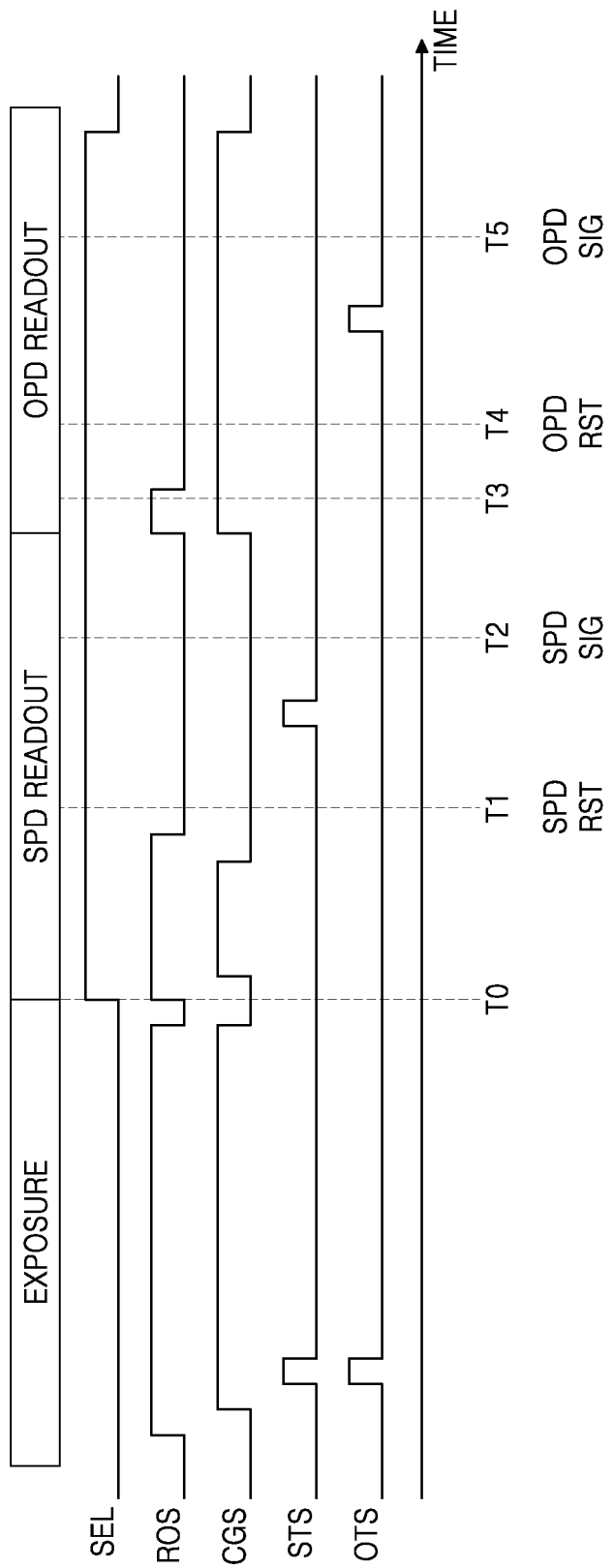
FIG. 3 is a timing diagram illustrating an operation of a pixel according to an example embodiment of the inventive concept.

FIG. 3 is a timing diagram illustrating an operation of a pixel according to an example embodiment of the inventive concept. For example, FIG. 3 is a timing diagram illustrating the operation of the pixel PX of FIG. 2 according to an example embodiment of the inventive concept.

Referring to FIG. 3, the pixel PX may reset the silicon photodiode SPD, the organic photodiode OPD, and the floating diffusion nodes FD1 and FD2 during an exposure period EXPOSURE, and read out first pixel signals corresponding to the silicon photodiode SPD during a first readout period SPD READOUT which is a readout period of the silicon photodiode SPD. The pixel PX may read out second pixel signals corresponding to the organic photodiode OPD during a second readout period OPD READOUT which is a readout period of the organic photodiode OPD. Hereinafter, operations performed in the exposure period EXPOSURE, the first readout period SPD READOUT, and the second readout period OPD READOUT will be described.

First, in the exposure period EXPOSURE, a selection signal SEL may maintain a logic low level, and the organic reset control signal ROS may transition from a logic low level to a logic high level to maintain a logic high level. Accordingly, the organic reset transistor ORG may be turned on, and the second floating diffusion node FD2 may be reset. The gain control signal CGS may transition from a logic low level to a logic high level to maintain a logic high level, and the conversion gain transistor DCG may be turned on. The second floating diffusion node FD2 may be connected to the first floating diffusion node FD1, and the first floating diffusion node FD1 may be reset.

The silicon transfer control signal STS and the organic transfer control signal OTS may transition from the logic low level to the logic high level after the organic reset control signal ROS and the gain control signal CGS transition from the logic low level to the logic high level. Accordingly, the silicon transfer transistor STG and the organic transfer transistor OTG may be turned on, and the silicon photodiode SPD and the organic photodiode OPD may be reset.

After the silicon transmission control signal STS and the organic transmission control signal OTS transition from the logic high level to the logic low level, the organic photo-diode OPD and the silicon photodiode SPD may receive light signals to generate and accumulate photocharges according to the light signals. Thereafter, the organic reset control signal ROS and the gain control signal CGS may transition from a logic high level to a logic low level.

The readout period may start at a start time T0. In the first readout period SPD READOUT, the selection signal SEL may transition from the logic low level to the logic high level from the start time T0 to maintain the logic high level during the remaining readout period. The selection transistor SX may be turned on during the readout period. The gain control signal CGS may transition from a logic low level to a logic high level to maintain a logic high level. Accordingly, the conversion gain transistor DCG may be turned on, and the first floating diffusion node FD1 may be connected to the second floating diffusion node FD2. In addition, the organic reset control signal ROS may transition from the logic low level to the logic high level at the start time T0 to maintain the logic high level. Accordingly, the organic reset transistor ORG may be turned on, and the first floating diffusion node FD1 and the second floating diffusion node FD2 may be reset (a reset operation). For example, the first floating diffusion node FD1 and the second floating diffusion node FD2 may be reset based on a pixel voltage VDD.

The gain control signal CGS may transition from a logic high level to a logic low level, and the organic reset control signal ROS may transition from a logic high level to a logic low level. That is, the conversion gain transistor DCG may be turned off, and the organic reset transistor ORG may be turned off. A first reset signal SPD RST corresponding to voltages of the reset floating diffusion nodes FD1 and FD2 may be output as a pixel signal. That is, referring to FIG. 3, a pixel signal output at a first time T1 may be the first reset signal SPD RST of the silicon photodiode SPD.

After the first time T1, the gain control signal CGS may transition from a logic high level to a logic low level. The pixel PX may operate in the HCG mode. A silicon transfer control signal STS may transition from a logic low level to a logic high level. Accordingly, the silicon transfer transistor STG may be turned on, and charges generated from the silicon photodiode SPD may move to and be accumulated (an accumulation operation) in the first floating diffusion node FD1. The silicon transfer control signal STS may transition from a logic high level to a logic low level, and the silicon transfer transistor STG may be turned off. A first image signal SPD SIG corresponding to the amount of charges accumulated in the first floating diffusion node FD1 may be output as a pixel signal. That is, referring to FIG. 3, a pixel signal output at a second time T2 may be the first image signal SPD SIG of the silicon photodiode SPD.

After the second time T2, in the second readout period OPD READOUT, the organic reset control signal ROS may transition from a logic low level to a logic high level. In addition, the gain control signal CGS may also transition from a logic low level to a logic high level and maintain a logic high level. Accordingly, the organic reset transistor ORG and the conversion gain transistor DCG may be turned on, and the first floating diffusion node FD1 and the second floating diffusion node FD2 may be reset. For example, referring to FIG. 3, charges remaining after pixel signals of the silicon photodiode SPD are output at a third time T3 may be removed.

After the third time T3, the organic reset control signal ROS may transition from the logic high level to the logic low level. The organic reset transistor ORG may be turned off. A second reset signal OPD RST corresponding to voltages of the reset first floating diffusion node FD1 and second floating diffusion node FD2 may be output as a pixel signal. That is, referring to FIG. 3, a pixel signal output at a fourth time T4 may be the second reset signal OPD RST of the organic photodiode OPD.

After the fourth time T4, the organic transmission control signal OTS may transition from a logic low level to a logic high level. Accordingly, the organic transfer transistor OTG may be turned on, and charges generated in the organic photodiode OPD may move to and be accumulated (an accumulation operation) in the second floating diffusion node FD2 and the first floating diffusion node FD1. The organic transfer control signal OTS may transition from a logic high level to a logic low level, and the organic transfer transistor OTG may be turned off. The second image signal OPD SIG corresponding to the amount of charges accumulated in the second floating diffusion node FD2 and the first floating diffusion node FD1 may be output as a pixel signal. That is, referring to FIG. 3, a pixel signal output at a fifth time T5 may be the second image signal OPD SIG of the organic photodiode OPD.

Figure 4:
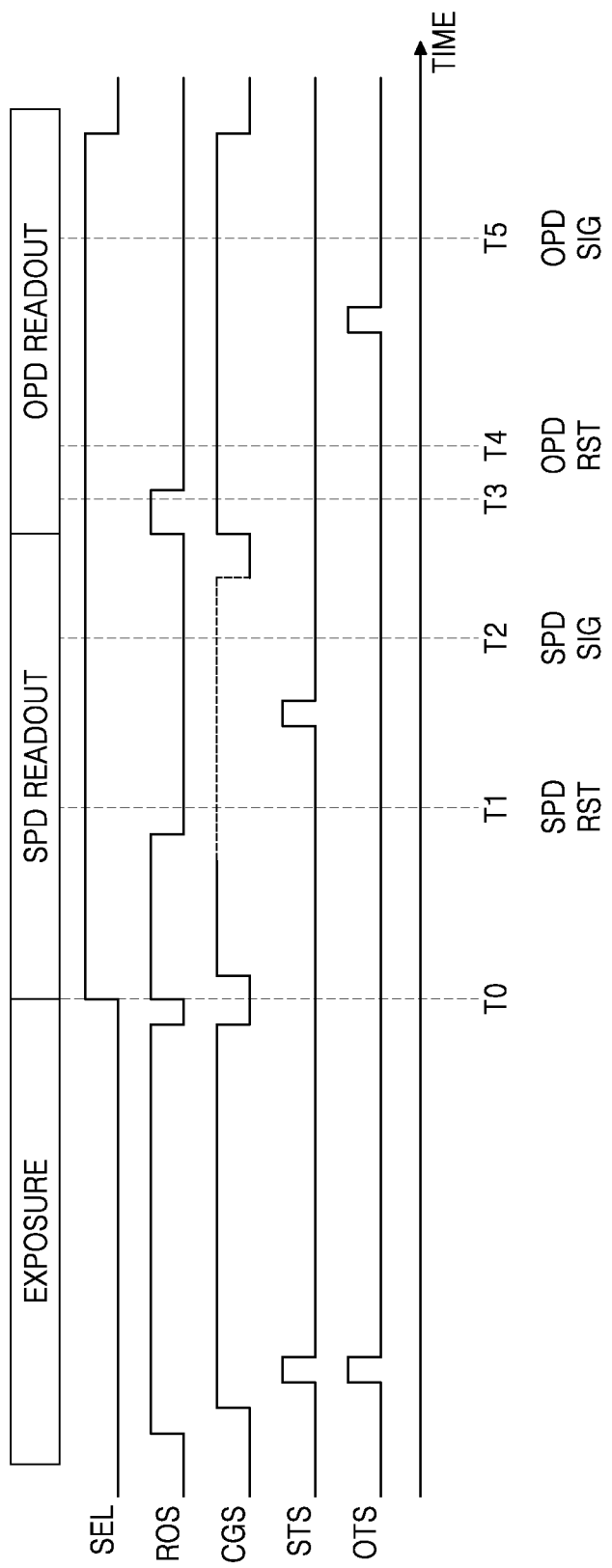
FIG. 4 is a timing diagram illustrating an operation of a pixel according to an example embodiment of the inventive concept.

FIG. 4 is a timing diagram illustrating an operation of a pixel according to an example embodiment of the inventive concept. For example, FIG. 4 is a timing diagram illustrating a modifiable embodiment of FIG. 3.

Compared to the embodiment of FIG. 3, in the embodiment of FIG. 4, the silicon photodiode SPD may include an LCG mode operation. In the exposure period EXPOSURE, the organic reset control signal ROS and the gain control signal CGS may maintain a logic high level shorter than that of the embodiment of FIG. 3. In the embodiment of FIG. 4, control signals when pixel signals of the silicon photodiode SPD and the organic photodiode OPD are respectively output may be substantially the same as those described above in FIG. 3, and thus, for convenience of explanation, redundant descriptions thereof are omitted.

In the first readout period SPD READOUT, the gain control signal CGS may transition from a logic low level to a logic high level to maintain a logic high level. Accordingly, the conversion gain transistor DCG may be turned on, and the first floating diffusion node FD1 may be connected to the second floating diffusion node FD2. In addition, the organic reset control signal ROS may transition from the logic low level to the logic high level at the start time T0 to maintain the logic high level.

The gain control signal CGS may transition from the logic high level to the logic low level, and the organic reset control signal ROS may be maintained at the logic high level. The pixel PX may operate in an LCG mode. The first reset signal SPD RST may be output at the first time T1, and the first image signal SPD SIG may be output at the second time T2.

Figure 5:
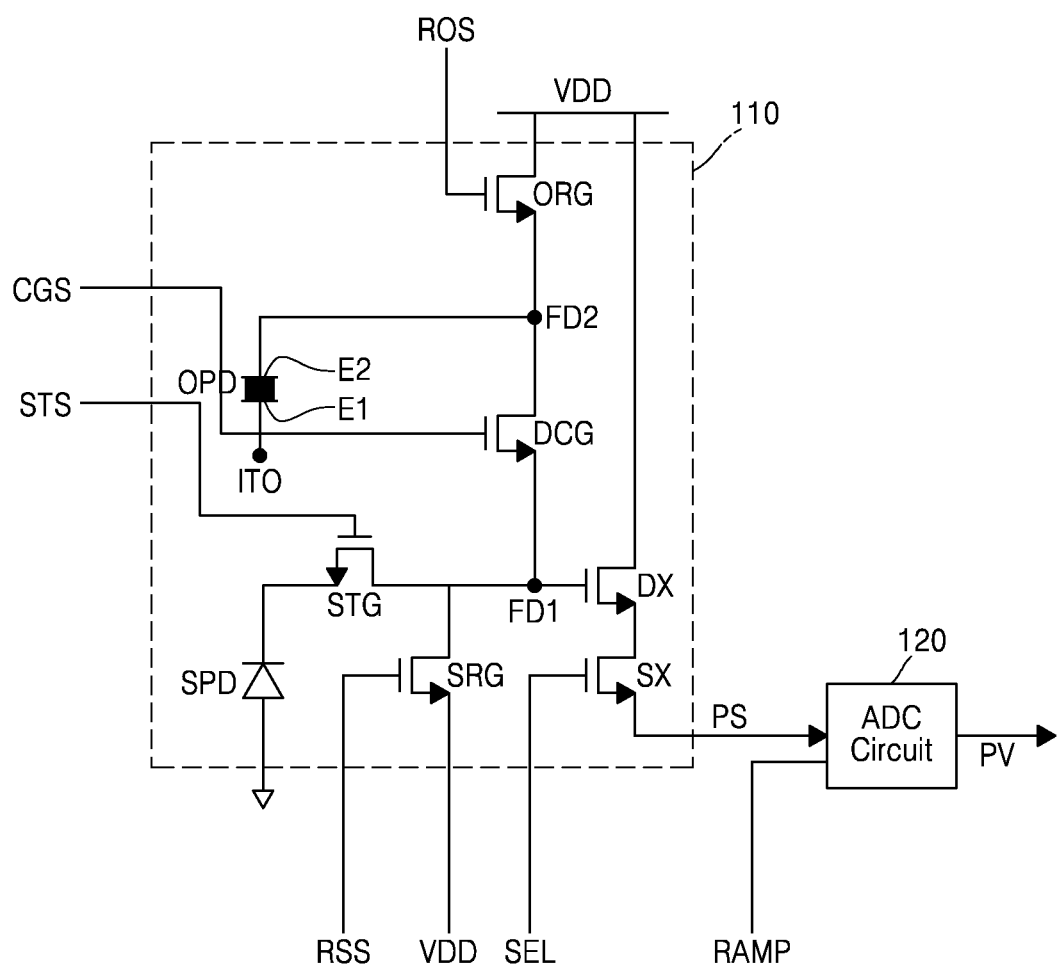
FIG. 5 is a circuit diagram illustrating a part of a pixel according to an example embodiment of the inventive concept.

FIG. 5 is a circuit diagram illustrating a part of a pixel according to an example embodiment of the inventive concept. The organic photodiode OPD, the silicon photodiode SPD, the conversion gain transistor DCG, the driving transistor DX, and the selection transistor SX of FIG. 5 may respectively correspond to the organic photodiode OPD, the silicon photodiode SPD, the conversion gain transistor DCG, the driving transistor DX, and the selection transistor SX of FIG. 2, and thus, for convenience of explanation, redundant descriptions thereof are omitted.

Referring to FIGS. 1B and 5, the pixel PX may include the photo detection circuit 110 and the ADC 120. The photo detection circuit 110 may include a plurality of photodiodes, for example, the organic photodiode OPD and the silicon photodiode SPD. The photo detection circuit 110 may include a plurality of transistors, for example, the silicon transfer transistor STG, the organic reset transistor ORG, the driving transistor DX, the selection transistor SX, and the conversion gain transistor DCG. The control signals ROS, CGS, STS, RSS, and SEL may be applied to the pixel PX, and at least some of the control signals ROS, CGS, STS, RSS, and SEL may be generated by the pixel driver 200.

An external voltage ITO may be applied to the first electrode E1 of the organic photodiode OPD, and the second electrode E2 may be connected to the second floating diffusion node FD2. That is, the second electrode E2 of the organic photodiode OPD may be connected to a second terminal of the conversion gain transistor DCG and a second terminal of the organic reset transistor ORG. Photo charges generated by the organic photodiode OPD may be accumulated in the second floating diffusion node FD2.

The photo detection circuit 110 may include a silicon reset transistor SRG. The silicon reset transistor SRG may reset charges accumulated in the first floating diffusion node FD1. A reset voltage (e.g., the pixel voltage VDD) may be applied to a first terminal of the silicon reset transistor SRG, and a second terminal of the silicon reset transistor SRG may be connected to the first floating diffusion node FD1. Embodiments of the inventive concept are not limited thereto, and a voltage other than the pixel voltage VDD may be applied to the first terminal. The silicon reset transistor SRG may be turned on or turned off in response to the silicon reset control signal RSS received from the pixel driver 200, and the charges accumulated in the first floating diffusion node FD1 may be discharged so that the first floating diffusion node FD1 may be reset.

The pixel PX may include the ADC 120. The ADC 120 may compare the pixel signal PS with the ramp signal RAMP, thereby converting the pixel signal PS into the pixel value PV, which is a digital signal. For example, the ADC 120 may generate the pixel value PV based on a comparison result of comparing the ramp signal RAMP having a rising inclination and the pixel signal PS.

Figure 6:
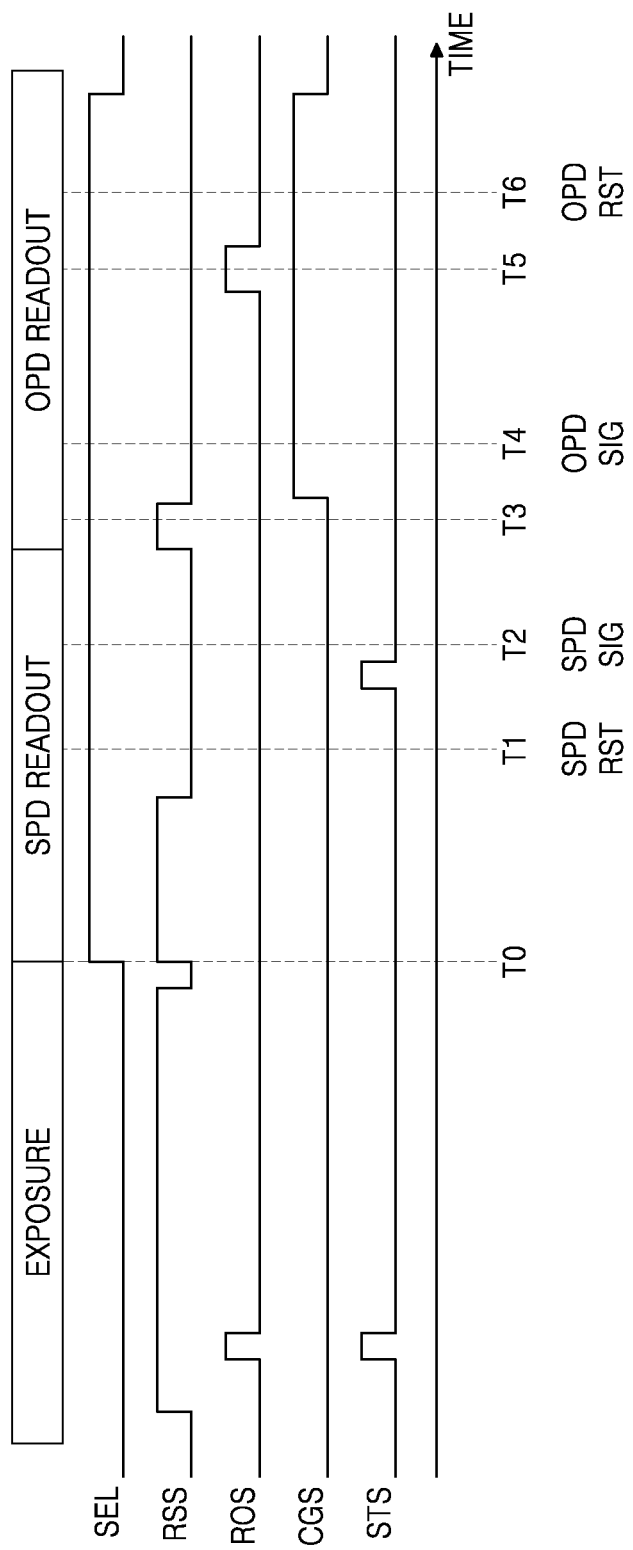
FIG. 6 is a timing diagram illustrating an operation of a pixel according to an example embodiment of the inventive concept

FIG. 6 is a timing diagram illustrating an operation of a pixel according to an example embodiment of the inventive concept. For example, FIG. 6 is a timing diagram illustrating the operation of the pixel PX of FIG. 5 according to an example embodiment of the inventive concept.

Referring to FIG. 6, the pixel PX may reset the silicon photodiode SPD, the organic photodiode OPD, and the floating diffusion nodes FD1 and FD2 during the exposure period EXPOSURE, and read out first pixel signals corresponding to the silicon photodiode SPD during the first readout period SPD READOUT which is a readout period of the silicon photodiode SPD. The pixel PX may read out second pixel signals corresponding to the organic photodiode OPD during the second readout period OPD READOUT which is a readout period of the organic photodiode OPD. Hereinafter, operations performed in the first readout period SPD READOUT and the second readout period OPD READOUT will be described.

First, in the exposure period EXPOSURE, the selection signal SEL may maintain a logic low level, and the silicon reset control signal RSS may transition from a logic low level to a logic high level to maintain a logic high level. Accordingly, the silicon reset transistor SRG may be turned on, and the first floating diffusion node FD1 may be reset. During the exposure period EXPOSURE, the gain control signal CGS may maintain a logic low level.

After the silicon reset control signal RSS transitions from the logic low level to the logic high level, the organic reset control signal ROS may transition from the logic low level to the logic high level. Accordingly, the organic reset transistor ORG may be turned on, and the second floating diffusion node FD2 and the organic photodiode OPD may be reset.

The silicon transfer control signal STS may transition from the logic low level to the logic high level after the silicon reset control signal RSS transitions from the logic low level to the logic high level. Accordingly, the silicon transfer transistor STG may be turned on, and the silicon photodiode SPD may be reset.

After the silicon transfer control signal STS and the organic reset control signal ROS transition from the logic high level to the logic low level, the organic photodiode OPD and the silicon photodiode SPD receive light signals to generate and accumulate photo charges according to the light signals. Thereafter, the silicon reset control signal RSS may transition from a logic high level to a logic low level.

At the start time T0, a readout period may be started. In the first readout period SPD READOUT, the selection signal SEL may transition from the logic low level to the logic high level from the start time T0 to maintain the logic high level during the remaining readout period. The selection transistor SX may be turned on during the readout period. The gain control signal CGS may maintain a logic low level during the first readout period SPD READOUT. The organic reset control signal ROS may maintain a logic low level during the first readout period SPD READOUT. Accordingly, in an example embodiment, the conversion gain transistor DCG and the organic reset transistor ORG may be turned off, and the first floating diffusion node FD1 and the second floating diffusion node FD2 are not connected.

The silicon reset control signal RSS may transition from the logic low level to the logic high level at the start time T0 to maintain the logic high level. Accordingly, the silicon reset transistor SRG may be turned on, and the first floating diffusion node FD1 may be reset (a reset operation). For example, the first floating diffusion node FD1 may be reset based on the pixel voltage VDD.

When the reset operation is completed, the silicon reset control signal RSS may transition from a logic high level to a logic low level, and the silicon reset transistor SRG may be turned off. The first reset signal SPD RST corresponding to voltage of the reset first floating diffusion node FD1 may be output as a pixel signal. That is, referring to FIG. 6, the pixel signal output at the first time T1 may be the first reset signal SPD RST of the silicon photodiode SPD.

After the first time T1, the silicon transfer control signal STS may transition from a logic low level to a logic high level. Accordingly, the silicon transfer transistor STG may be turned on, and charges generated from the silicon photodiode SPD may move to and be accumulated (an accumulation operation) in the first floating diffusion node FD1. The silicon transfer control signal STS may transition from a logic high level to a logic low level, and the silicon transfer transistor STG may be turned off. The first image signal SPD SIG corresponding to the amount of charges accumulated in the first floating diffusion node FD1 may be output as a pixel signal. That is, referring to FIG. 6, a pixel signal output at the second time T2 may be the first image signal SPD SIG of the silicon photodiode SPD.

After the second time T2, in the second readout period OPD READOUT, the silicon reset control signal RSS may transition from a logic low level to a logic high level. The silicon reset transistor SRG may be turned on. The first floating diffusion node FD1 may be reset. For example, referring to FIG. 6, charges remaining in the first floating diffusion node FD1 may be removed after the pixel signals of the silicon photodiode SPD are output at the third time T3.

After the third time period T3, the silicon reset control signal RSS may transition from the logic high level to the logic low level. The silicon reset transistor SRG may be turned off. The gain control signal CGS may transition from a logic low level to a logic high level, and the conversion gain transistor DCG may be turned on. The first floating diffusion node FD1 and the second floating diffusion node FD2 may be connected to each other, and charges generated from the organic photodiode OPD may move to and be accumulated (an accumulation operation) in the second floating diffusion node FD2 and the first floating diffusion node FD1. The second image signal OPD SIG corresponding to the amount of charges accumulated in the first floating diffusion node FD1 and the second floating diffusion node FD2 may be output as a pixel signal. That is, referring to FIG. 6, a pixel signal output at the fourth time T4 may be the second image signal OPD SIG of the organic photodiode OPD.

After the fourth time T4, the organic reset control signal ROG may transition from a logic low level to a logic high level. Accordingly, the organic reset transistor ORG may be turned on, and the first floating diffusion node FD1 and the second floating diffusion node FD2 may be reset. For example, referring to FIG. 6, the charges remaining in the first floating diffusion node FD1 and the second floating diffusion node FD2 may be removed after the pixel signals of the organic photodiode OPD are output at the fifth time T5.

After the fifth time T5, the organic reset control signal ROS may transition from the logic high level to the logic low level. The organic reset transistor ORG may be turned off. The second reset signal OPD RST corresponding to the voltage of the reset first floating diffusion node FD1 may be output as a pixel signal. That is, referring to FIG. 6, a pixel signal output at a sixth time T6 may be the second reset signal OPD RST of the organic photodiode OPD.

Figure 7A:
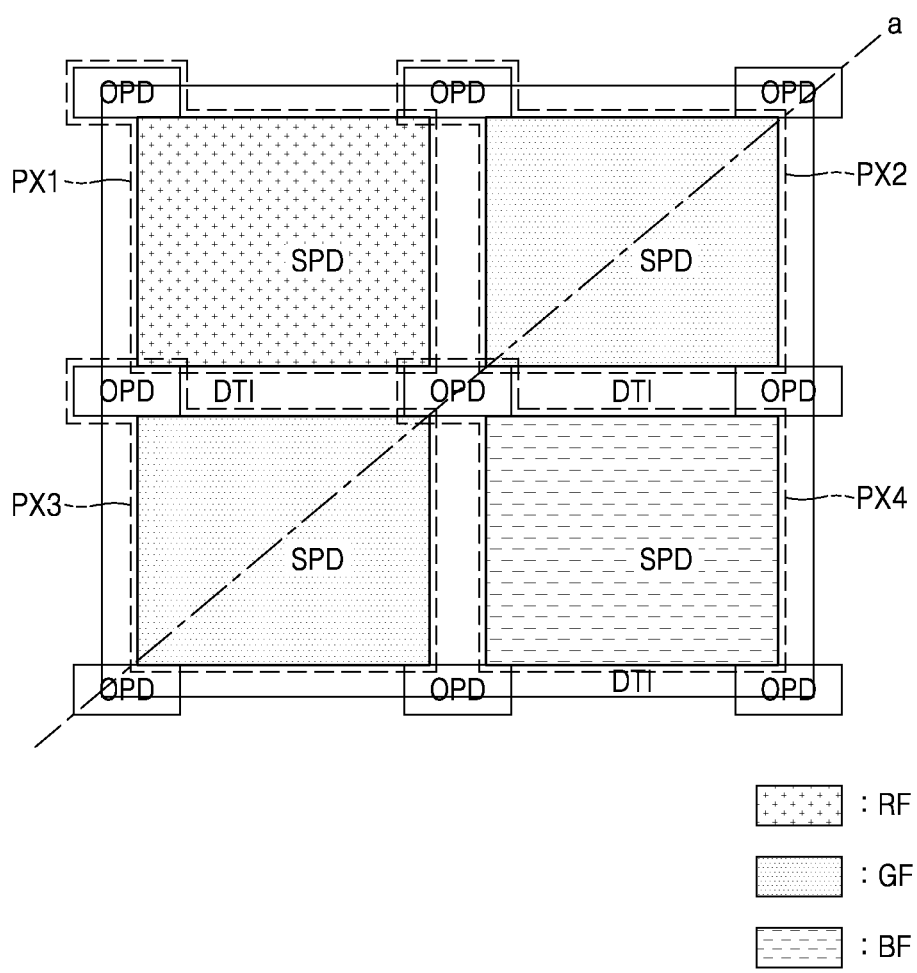
FIGS. 7A and 7B are diagrams illustrating a split photodiode structure of a pixel according to an example embodiment of the inventive concept.
Figure 7B:
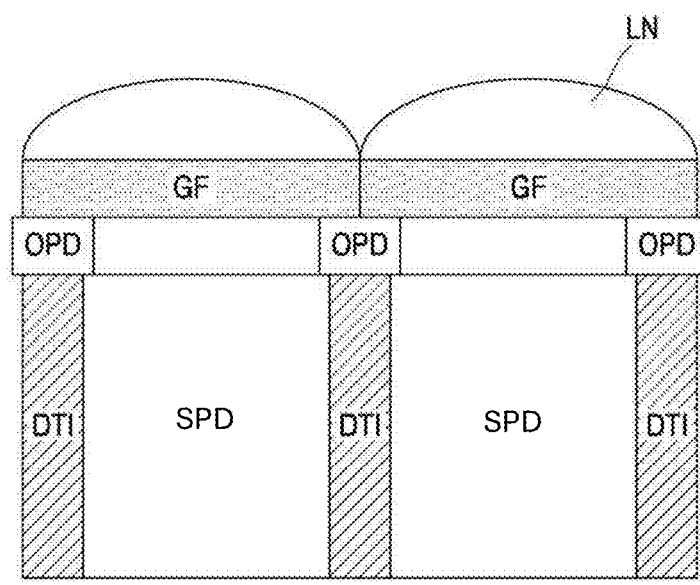

FIGS. 7A and 7B are diagrams illustrating a split photodiode structure of a pixel according to an example embodiment of the inventive concept. For example, FIG. 7A is a plan view of the pixel, and FIG. 7B is a cross-sectional view of the pixel of FIG. 7A cut in a direction a. The pixel of FIGS. 7A and 7B may be applied to the pixel according to FIGS. 2 and 5.

Referring to FIGS. 7A and 7B, a pixel array (e.g., the pixel array 100 of FIGS. 1A and 1B) may include a plurality of pixels PX1 to PX4 arranged in a matrix on a plane. Four pixels are illustrated in FIG. 7A, but the number of pixels is not limited thereto.

Each of the plurality of pixels PX1 to PX4 may include a micro lens, a color filter, and a photoelectric conversion element. In some example embodiments, each of the plurality of pixels PX1 to PX4 may further include a protective layer and an insulating structure. The microlens may be disposed on the photoelectric conversion element, and may be configured to collect light incident from outside of the image sensor 10 to be incident on the photoelectric conversion element.

Each of the plurality of pixels PX1 to PX4 may include the silicon photodiode SPD and the organic photodiode OPD. In an example embodiment, a light receiving area of the silicon photodiode SPD may be greater than or about equal to a light receiving area of the organic photodiode OPD. For example, as shown in FIG. 7A, the silicon photodiode SPD of each pixel PX may have a large light receiving area, and the organic photodiode OPD may have a narrow light receiving area. The sensitivity of the organic photodiode OPD may be adjusted based on an external voltage. For example, the organic photodiode OPD has a narrower light receiving area than that of the silicon photodiode SPD, and when a low external voltage is applied to the organic photodiode OPD, the sensitivity of the organic photodiode OPD may be lowered.

Because the silicon photodiode SPD has a large light receiving area, the silicon photodiode SPD may be saturated faster than the organic photodiode LPD. Accordingly, the silicon photodiode SPD may be used in a low illuminance region, and the organic photodiode OPD may be used in a high illuminance region.

The pixel array may include deep trench isolations (DTIs) formed between the silicon photodiodes SPD of each of the plurality of pixels PX1 to PX4. The silicon photodiodes SPDs may be electrically separated by the DTIs. For example, the silicon photodiode SPD of the first pixel PX1 and the silicon photodiode SPD of the second pixel PX2 may be electrically separated by the DTIs.

In an example embodiment, the organic photodiode OPD may be positioned at a point where the DTIs intersect. In an example embodiment, the organic photodiode OPD is not stacked on the silicon photodiode SPD, but rather, is positioned on the DTI. However, example embodiments of the inventive concept are not limited thereto. For example, according to example embodiments, the organic photodiode OPD may be stacked on a part of the silicon photodiode SPD and a part of the DTI. The organic photodiode OPD may be stacked on the DTI, so that the organic photodiode OPD may minimally overlap the silicon photodiode SPD, and reduction in the transmittance of the silicon photodiode SPD may be prevented or reduced.

The silicon photodiode SPD may sense light in a visible ray region. The organic photodiode OPD may sense at least one of light in a visible ray region and light in a region having a longer wavelength than light in the visible ray region. According to an example embodiment, the silicon photodiode SPD may sense light in the visible light region, and the organic photodiode OPD may sense light in an infrared region. For example, the silicon photodiode SPD may sense light of a wavelength of about 500 nm, and the organic photodiode OPD may sense light of a wavelength of about 800 nm. However, example embodiments of the inventive concept are not limited thereto. The organic photodiode OPD and the silicon photodiode SPD may be implemented to sense light of different wavelengths, and thus, light having a wide range of wavelengths may be sensed.

A color filter may selectively transmit a light signal of a specific wavelength band, and may be disposed between a microlens LN and the organic photodiode OPD. As shown in FIG. 7A, each of the first to fourth pixels PX1 to PX4 may include one of a green color filter GF, a red color filter RF, and a blue color filter BF. For example, the first pixel PX1 may include the red color filter RF, the second pixel PX2 and the third pixel PX3 may include the green color filter GF, and the fourth pixel PX4 may include the blue color filter BF. However, example embodiments of the inventive concept are not limited thereto. For example, according to example embodiments, each of the first to fourth pixels PX1 to PX4 may include at least one of a white color filter, a yellow color filter, a cyan color filter, and a magenta color filter.

Figure 8A:
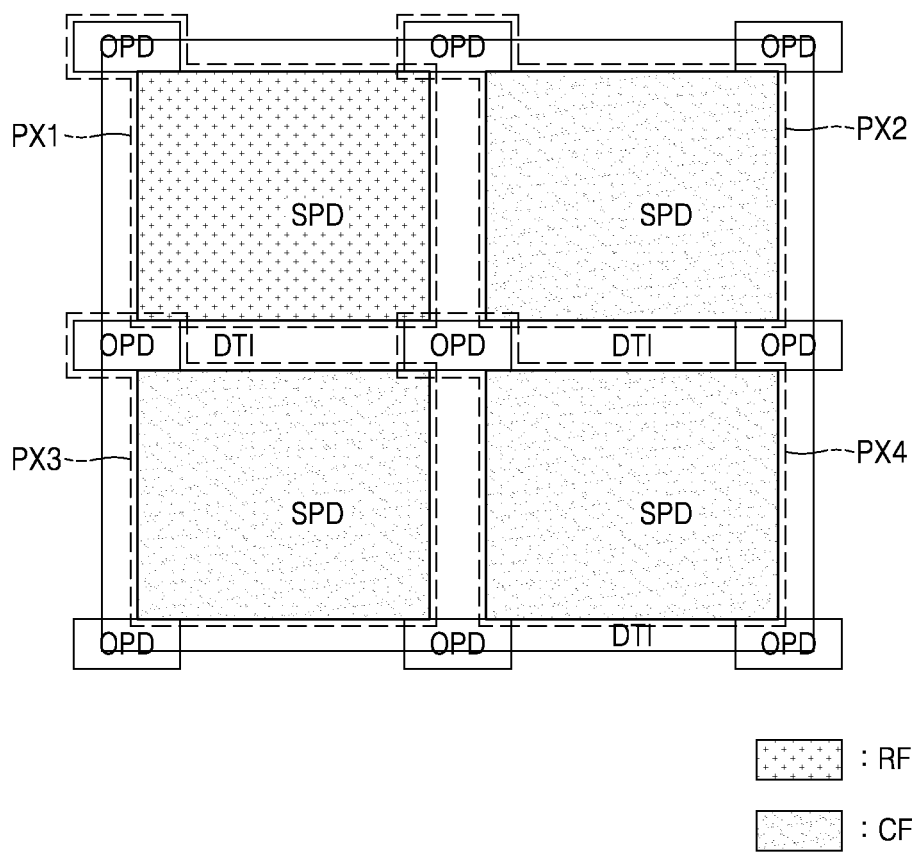
FIGS. 8A and 8B are diagrams illustrating a pixel including a color filter according to an example embodiment of the inventive concept.
Figure 8B:
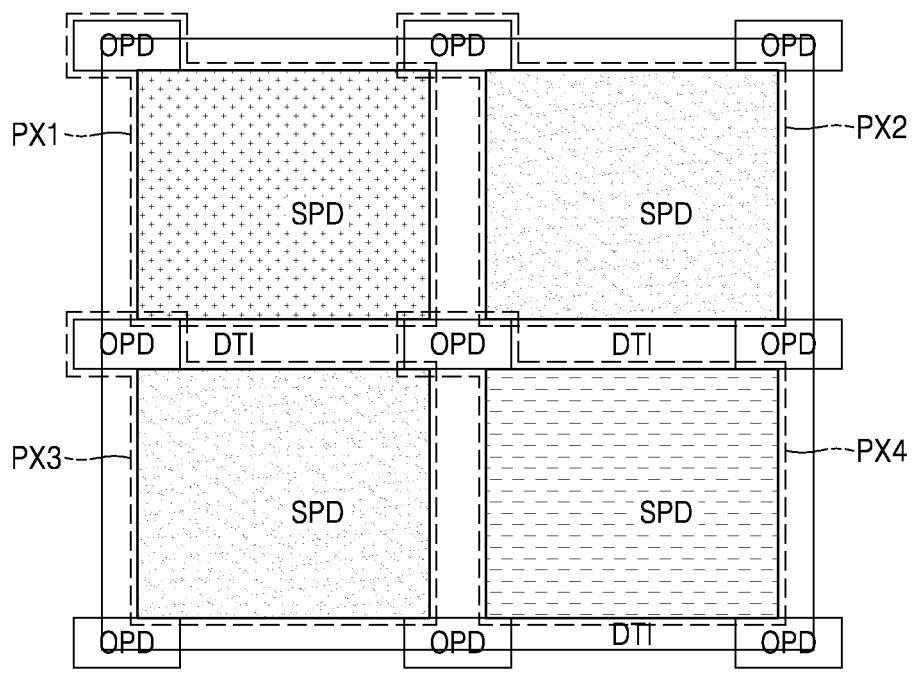

FIGS. 8A and 8B are diagrams illustrating a pixel including a color filter according to an example embodiment of the inventive concept.

Referring to FIG. 8A, each of the first to fourth pixels PX1 to PX4 may include one of the red color filter RF and the cyan color filter CF. For example, the first pixel PX1 may include the red color filter RF, and each of the second pixel PX2, the third pixel PX3, and the fourth pixel PX4 may include the cyan color filter CF.

Referring to FIG. 8B, each of the first to fourth pixels PX1 to PX4 may include one of the red color filter RF, the blue color filter BF, and the cyan color filter CF. For example, the first pixel PX1 may include the red color filter RF, the second pixel PX2 and the third pixel PX3 may include the cyan color filter CF, and the fourth pixel PX4 may include the blue color filter BF.

Figure 9:
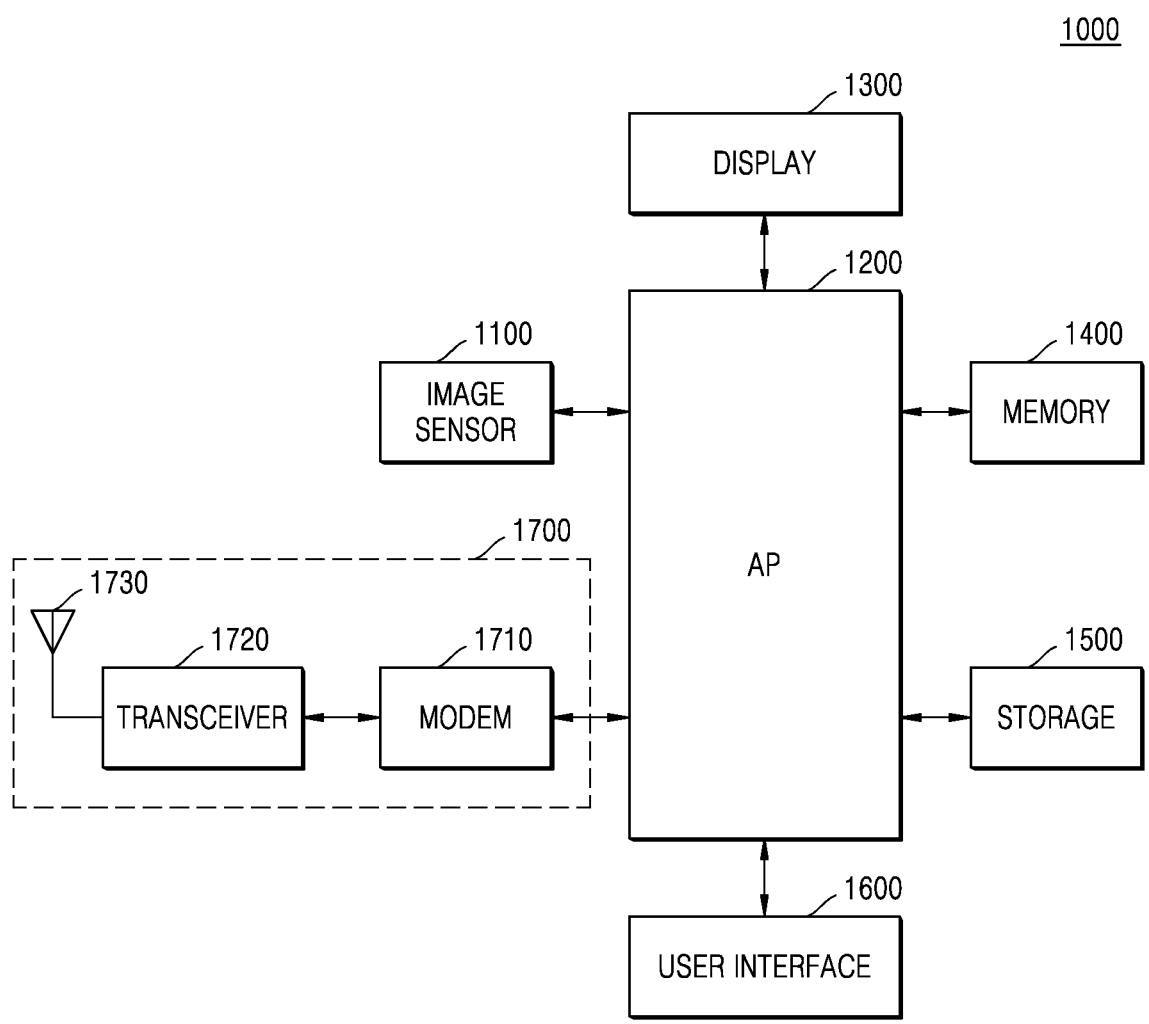
FIG. 9 is a block diagram illustrating an electronic device according to an example embodiment of the inventive concept.

FIG. 9 is a block diagram illustrating an electronic device 1000 according to an example embodiment of the inventive concept.

Referring to FIG. 9, the electronic device 1000 may include an image sensor 1100, an application processor 1200, a display 1300, a memory 1400, a storage 1500, a user interface 1600, and a wireless transceiver 1700. The image sensor 1100 of FIG. 9 may correspond to the image sensor 10 of FIGS. 1A and 1B. For convenience of explanation, redundant descriptions between FIGS. 1A to 8B and FIG. 9 are omitted.

The application processor 1200 may control the overall operation of the electronic device 1000 and may be provided as a system-on-chip (SoC) that drives an application program, an operating system, etc. The application processor 1200 may receive image data from the image sensor 1100 and may perform image processing on the received image data. In some example embodiments, the application processor 1200 may store the received image data and/or the processed image data in the memory 1400 or the storage 1500.

The memory 1400 may store programs and/or data processed or executed by the application processor 1200. The storage 1500 may be implemented as a non-volatile memory device such as, for example, NAND flash or resistive memory. For example, the storage 1500 may be provided as a memory card (e.g., MMC, eMMC, SD, and micro SD), etc. The storage 1500 may store data and/or a program with respect to an execution algorithm that controls an image processing operation of the application processor 1200, and the data and/or program may be loaded into the memory 1400 when the image processing operation is performed.

The user interface 1600 may be implemented as various devices capable of receiving a user input, such as, for example, a keyboard, a curtain key panel, a touch panel, a fingerprint sensor, a microphone, etc. The user interface 1600 may receive a user input and provide a signal corresponding to the received user input to the application processor 1200. The wireless transceiver 1700 may include a modem 1710, a transceiver 1720, and an antenna 1730.

Figure 10:
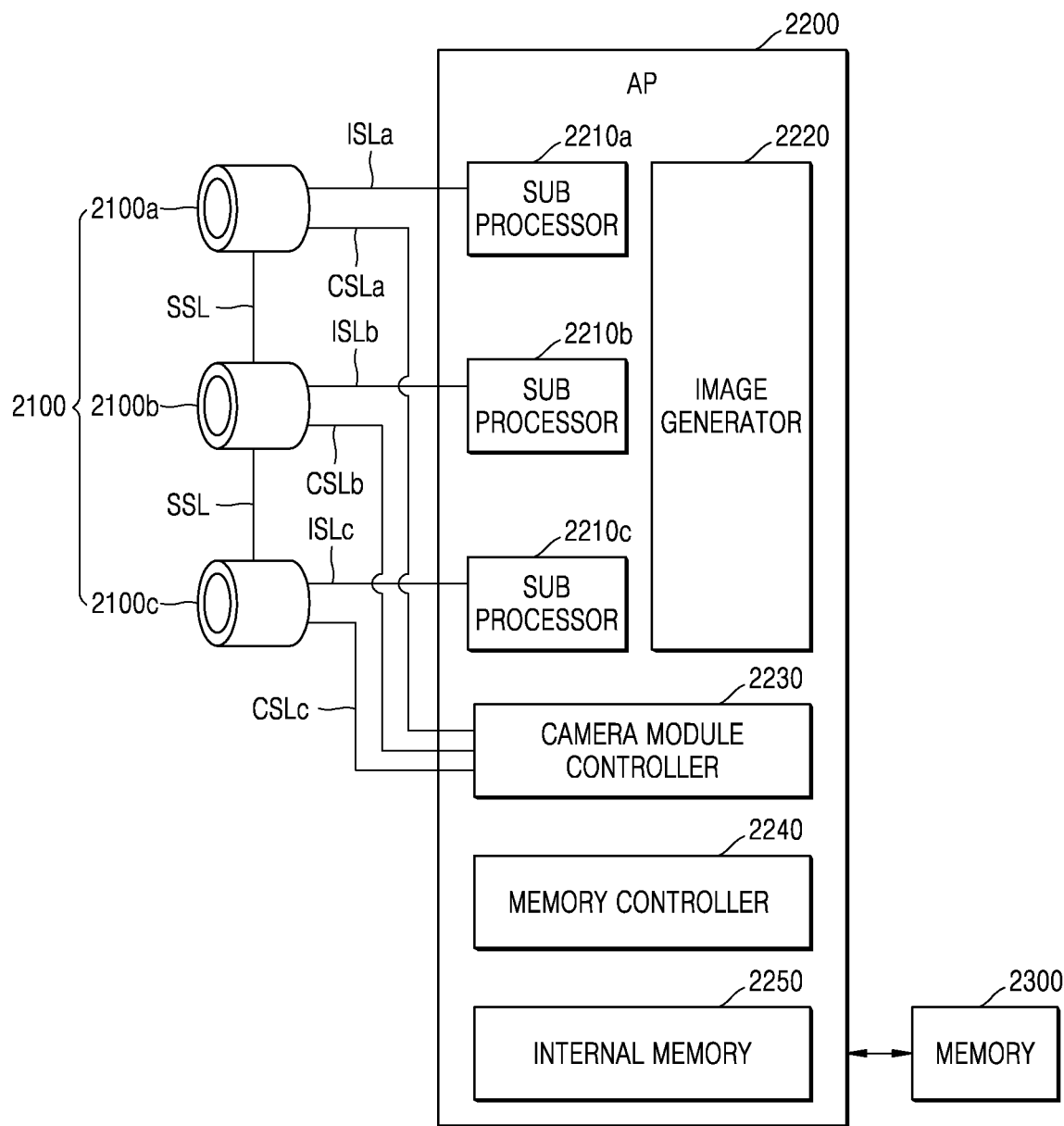
FIG. 10 is a block diagram illustrating a part of an electronic device according to an example embodiment of the inventive concept.
Figure 11:
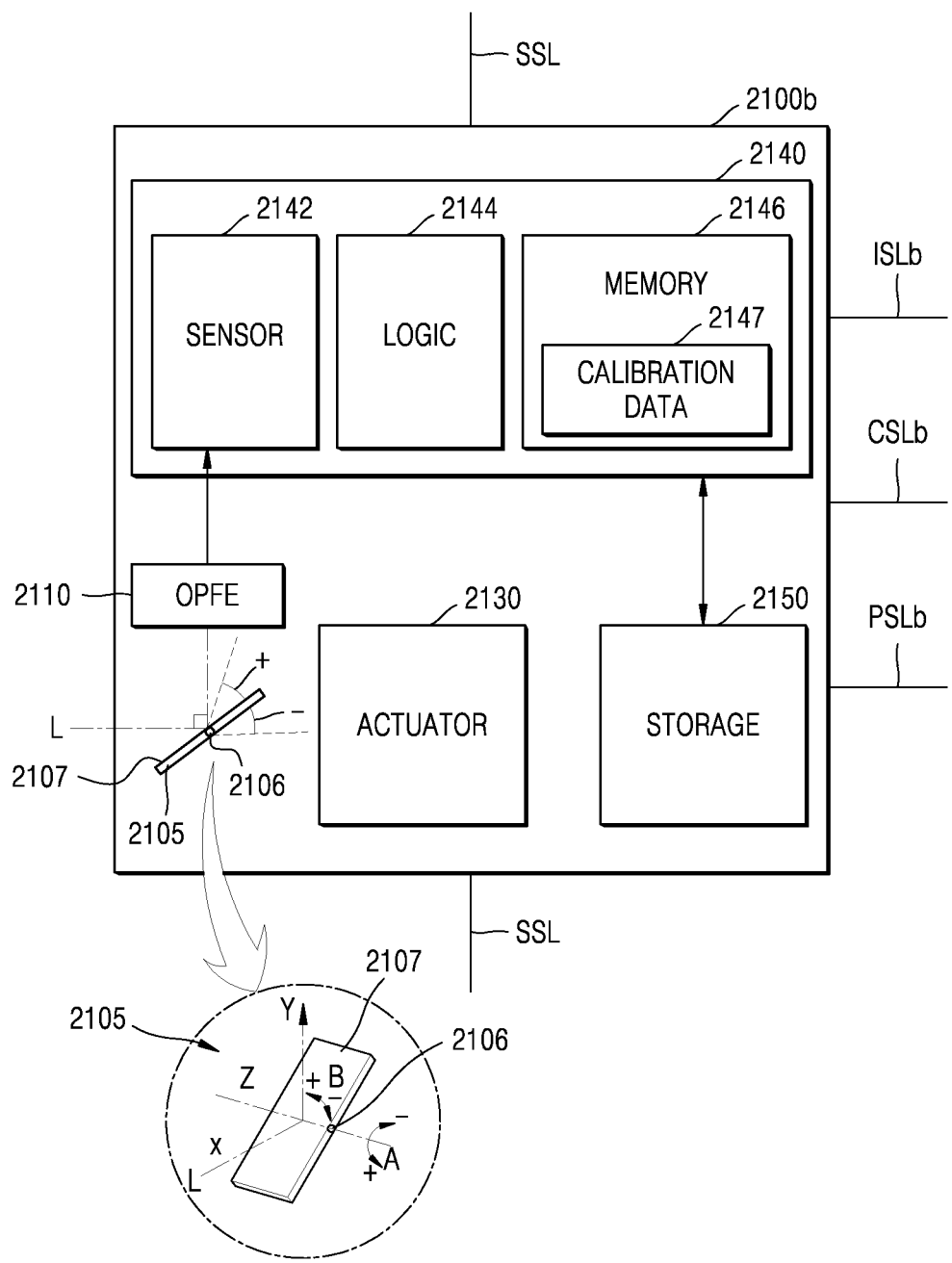
FIG. 11 is a block diagram illustrating a specific configuration of a camera module according to an example embodiment of the inventive concept.

FIG. 10 is a block diagram illustrating a part of an electronic device 2000 according to an example embodiment of the inventive concept. FIG. 11 is a block diagram illustrating a specific configuration of a camera module 2100b according to an example embodiment of the inventive concept. For example, FIG. 10 is a diagram illustrating the electronic device 2000 as a part of the electronic device 1000 of FIG. 9, and FIG. 11 is a diagram illustrating a specific configuration of the camera module 2100b of FIG. 10.

Referring to FIG. 10, the electronic device 2000 may include a multi-camera module 2100, an application processor 2200, and a memory 2300. The memory 2300 may perform the same function as the memory 1400 illustrated in FIG. 9, and thus, for convenience of explanation, a redundant description thereof is omitted.

The electronic device 2000 may capture and/or store an image of a subject using a CMOS image sensor, and may be implemented as, for example, a mobile phone, a tablet computer, or a portable electronic device. The portable electronic device may include, for example, a laptop computer, a mobile phone, a smartphone, a tablet PC, a wearable device, etc.

The multi-camera module 2100 may include a first camera module 2100a, a second camera module 2100b, and a third camera module 2100c. The multi-camera module 2100 may include the image sensor 10 of FIG. 1A or 1B. Although in FIG. 10, the multi-camera module 2100 is illustrated as including three camera modules 1100a to 1100c, example embodiments of the inventive concept are not limited thereto, and various numbers of camera modules may be included in the multi-camera module 2100.

Hereinafter, referring to FIG. 11, a detailed configuration of the camera module 2100b will be described in more detail, and the following description may be equally applied to other camera modules 2100a and 2100c according to example embodiments.

Referring to FIG. 11, the second camera module 2100b may include a prism 2105, an optical path folding element (OPFE) 2110, an actuator 2130, an image sensing device 2140, and a memory 2150.

The prism 2105 may include a reflective surface 2107 of a light reflective material to modify a path of a light L incident from outside of the image sensor 10.

According to an example embodiment, the prism 2105 may change the path of the light L incident in a first direction X to a second direction Y perpendicular to the first direction X. In addition, the prism 2105 may rotate the reflective surface 2107 of the light reflective material in an A direction with respect to a central axis 2106 or rotate the central axis 2106 in a B direction to change the path of the light L incident in the first direction X to the second direction Y perpendicular to the first direction X. At this time, the OPFE 2110 may also move in a third direction Z perpendicular to the first direction X and the second direction Y.

In an example embodiment, as shown, the maximum rotation angle of the prism 2105 in the A direction may be equal to or smaller than about 15 degrees in a plus (+)A direction, and greater than about 15 degrees in a minus (−)A direction, but example embodiments are not limited thereto.

In an example embodiment, the prism 2105 may move in a plus (+) or minus (−) B direction by about 20 degrees, or from about 10 degrees to about 20 degrees, or from about 15 degrees to about 20 degrees. In this regard, the angle of movement may be the same in the plus (+) or minus (−) B direction, or may be nearly similar in the range of about 1 degree.

In an example embodiment, the prism 2105 may move the reflective surface 2107 of the light reflective material in a third direction (e.g., Z direction) parallel to an extension direction of the central axis 2106.

The OPFE 2110 may include, for example, an optical lens including m (m is a natural number) groups. The m lenses may move in the second direction Y to change an optical zoom ratio of the camera module 2100b. For example, in case where a basic optical zoom magnification of the camera module 2100b is Z, when m optical lenses included in the OPFE 2110 are moved, the optical zoom magnification of the camera module 2100b may be changed to an optical zoom magnification of 3Z or 5Z or greater than 5Z.

The actuator 2130 may move the OPFE 2110 or an optical lens to a specific position. For example, the actuator 2130 may adjust the position of the optical lens so that the image sensor 2142 may be located at a focal length of the optical lens for accurate sensing.

The image sensing device 2140 may include an image sensor 2142, control logic 2144, an encoder 2145, and a memory 2146. The image sensor 2142 may sense an image of a sensing target by using the light L provided through the optical lens. The image sensor 2142 of FIG. 11 may be functionally similar to the image sensor 10 of FIGS. 1A and 1B, and thus, for convenience of explanation, a redundant description thereof is omitted. The control logic 2144 may control the overall operation of the second camera module 2100b. For example, the control logic 2144 may control the operation of the second camera module 2100b according to a control signal provided through the control signal line CSLb.

The memory 2146 may store information utilized for the operation of the second camera module 2100b, such as calibration data 2147. The calibration data 2147 may include information utilized for the second camera module 2100b to generate image data by using the light L provided from outside of the image sensor 10. The calibration data 2147 may include, for example, information about a degree of rotation described above, information about a focal length, information about an optical axis, etc. When the second camera module 2100b is implemented in the form of a multi-state camera in which the focal length is changed according to the position of the optical lens, the calibration data 2147 may include information related to a focal length value of the optical lens for each position (or each state) and auto focusing.

The memory 2150 may store image data sensed by the image sensor 2142. The memory 2150 may be disposed outside of the image sensing device 2140, and may be implemented in a stacked form with sensor chips included in the image sensing device 1140. In an example embodiment, the memory 2150 may be implemented as an electrically erasable programmable read-only memory (EEPROM), but example embodiments are not limited thereto.

Referring to FIGS. 10 and 11, in an example embodiment, one camera module (e.g., the first camera module 2100a) among the plurality of camera modules 2100a, 2100b, and 2100c may include four adjacent pixels (e.g., TETRA cells) sharing the same color information in one color filter, and the other camera module (e.g., the second camera module 2100b) may include nine adjacent pixels (e.g., NONA cells) sharing the same color information in one color filter, but example embodiments are not limited thereto.

In an example embodiment, each of the plurality of camera modules 2100a, 2100b, and 2100c may include the actuator 2130. Accordingly, each of the plurality of camera modules 2100a, 2100b, and 2100c may include the same or different calibration data 2147 according to the operation of the actuator 2130 included therein.

In an example embodiment, one camera module (e.g., the second camera module 2100b) among the plurality of camera modules 2100a, 2100b, and 2100c may be a folded lens type camera module including the prism 2105 and the OPFE 2110 described above, and the remaining camera modules (e.g., 2100a and 2100b) may be vertical type camera modules that do not include the prism 2105 and the OPFE 2110, but example embodiments are not limited thereto.

In an example embodiment, one camera module (e.g., the third camera module 2100c) among the plurality of camera modules 2100a, 2100b, and 2100c may be a vertical type depth camera that extracts depth information, for example, by using an infrared ray (IR). In this case, the application processor 2200 may merge the image data provided from such a depth camera with the image data provided from the other camera module (e.g., the first camera module 2100a or the second camera module 2100b) to generate a 3D depth image.

In an example embodiment, at least two camera modules (e.g., the first camera module 2100a or the second camera module 2100b) among the plurality of camera modules 2100a, 2100b, and 2100c may have different fields of view (FOV). In this case, for example, optical lenses of at least two camera modules (e.g., the first camera module 2100a or the second camera module 2100b) among the plurality of camera modules 2100a, 2100b, and 2100c may be different from each other, but example embodiments of the inventive concept are not limited thereto. For example, the first camera module 2100a among the plurality of camera modules 2100a, 2100b, and 2100c may have a smaller FOV than that of the second and third camera modules 2100b and 2100c. However, example embodiments of the inventive concept are not limited thereto, and the multi-camera module 2100 may further include a camera module having a greater FOV than those of the originally used camera modules 2100a, 2100b, and 2100c.

Also, in some example embodiments, FOV of each of the plurality of camera modules 2100a, 2100b, and 2100c may be different. In this case, the optical lenses included in the plurality of camera modules 2100a, 2100b, and 2100c may also be different from each other, but example embodiments of the inventive concept are not limited thereto.

In some example embodiments, the plurality of camera modules 2100a, 2100b, and 2100c may be physically separated from each other. That is, the plurality of camera modules 2100a, 2100b, and 2100c do not split and use a sensing region of one image sensor 2142, but rather, an independent image sensor 2142 may be disposed in each of the plurality of camera modules 2100a, 2100b, and 2100c.

The application processor 2200 may include a plurality of sub-processors 2210a, 2210b, and 2210c, a camera module controller 2230, a memory controller 2400, and an internal memory 250. The application processor 2200 may be implemented separately from the plurality of camera modules 2100a, 2100b, and 2100c. For example, the application processor 2200 and the plurality of camera modules 2100a, 2100b, and 2100c may be implemented as separate semiconductor chips by being separated from each other.

Image data or compressed data generated from each of the camera modules 2100a, 2100b, and 2100c may be provided to the corresponding sub-processors 2210a, 2210b, and 2210c through image signal lines ISLa, ISLb, and ISLc separated from each other. For example, image data or compressed data generated from the first camera module 2100a may be provided to the first sub-processor 2210a through the first image signal line ISLa, image data or compressed data generated from the second camera module 2100b may be provided to the second sub-processor 2210b through the second image signal line ISLb, and image data or compressed data generated from the third camera module 2100c may be provided to the third sub-processor 2210c through the third image signal line ISLc. Such transmission of image data may be performed using, for example, a camera serial interface (CSI) based on a Mobile Industry Processor Interface (MIPI), but example embodiments are not limited thereto.

In an example embodiment, one sub-processor may be arranged to correspond to a plurality of camera modules. For example, the first sub-processor 2210a and the third sub-processor 2210c are not implemented separately from each other as shown, but rather, may be integrated into one sub-processor, and the image data or the compressed data provided from the camera module 2100a and the camera module 2100c may be provided to the integrated sub-processor after being selected through a selection element (e.g., a multiplexer).

The camera module controller 2230 may provide a control signal to each of the camera modules 2100a, 2100b, and 2100c. The control signal generated from the camera module controller 2230 may be provided to the corresponding camera modules 2100a, 2100b, and 2100c, respectively, through the control signal lines CSLa, CSLb, and CSLc separated from each other.

As is traditional in the field of the inventive concept, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to example embodiments thereof, it will be understood by those of ordinary skill in the art that various changes in form and detail may be made therein without departing from the spirit and scope of the inventive concept as defined by the following claims.

What is claimed is:

1. An image sensor comprising:
   a substrate having a first surface and a second surface opposing the first surface; and
   a pixel array comprising a plurality of pixels in the substrate,
   wherein each of the plurality of pixels comprises:
   an organic photodiode of which a sensitivity is adjusted based on an external voltage;
   a silicon photodiode;
   a first floating diffusion node in which charges generated by the silicon photodiode are accumulated;
   a second floating diffusion node in which charges generated by the organic photodiode are accumulated;
   a conversion gain transistor having one end connected to the first floating diffusion node and another end connected to the second floating diffusion node; and
   a driving transistor configured to generate a pixel signal corresponding to a voltage of the first floating diffusion node,
   wherein the organic photodiode has a first width in a first direction,
   wherein the silicon photodiode has a second width in the first direction,
   wherein the second width is greater than the first width, and
   wherein the first direction is parallel to the first surface.

2. The image sensor of claim 1, wherein each of the plurality of pixels further comprises:

an organic reset transistor having one end connected to the second floating diffusion node and a reset voltage applied to another end;
a silicon transfer transistor having one end connected to the silicon photodiode and another end connected to the first floating diffusion node; and
an organic transfer transistor having one end connected to the organic photodiode and another end connected to the second floating diffusion node.

3. The image sensor of claim 2, wherein the image sensor is configured to,
in a readout period of the silicon photodiode, turn on the organic reset transistor and the conversion gain transistor to reset the first floating diffusion node and the second floating diffusion node,
after resetting the first floating diffusion node and the second floating diffusion node, turn off the organic reset transistor and the conversion gain transistor, and generate and output a first reset signal corresponding to a voltage of the reset first floating diffusion node as the pixel signal, and
after outputting the first reset signal, turn on the silicon transfer transistor to generate an image signal corresponding to an amount of charges generated by the silicon photodiode and accumulated in the first floating diffusion node as the pixel signal.

4. The image sensor of claim 2, wherein the image sensor is further configured to,
in a readout period of the organic photodiode, turn on the organic reset transistor and the conversion gain transistor to reset the first floating diffusion node and the second floating diffusion node,
after resetting the first floating diffusion node and the second floating diffusion node, turn off the organic reset transistor, and generate and output a second reset signal corresponding to voltages of the reset first floating diffusion node and second floating diffusion node as the pixel signal, and
after outputting the second reset signal, turn on the organic transfer transistor to generate an image signal corresponding to an amount of charges generated by the organic photodiode and accumulated in the second floating diffusion node as the pixel signal.

5. The image sensor of claim 1, wherein each of the plurality of pixels further comprises:
an organic reset transistor having one end connected to the second floating diffusion node and a reset voltage applied to another end;
a silicon transfer transistor having one end connected to the silicon photodiode and another end connected to the first floating diffusion node; and
a silicon reset transistor having one end connected to the first floating diffusion node and the reset voltage applied to another end.

6. The image sensor of claim 5, wherein the image sensor is further configured to,
in a readout period of the silicon photodiode, turn on the silicon reset transistor to reset the first floating diffusion node,
after resetting the first floating diffusion node, turn off the silicon reset transistor, and generate and output a first reset signal corresponding to a voltage of the reset first floating diffusion node as the pixel signal, and
after outputting the first reset signal, turn on the silicon transfer transistor to generate an image signal corresponding to an amount of charges generated by the silicon photodiode and accumulated in the first floating diffusion node as the pixel signal.

7. The image sensor of claim 5, wherein the image sensor is further configured to,
in a readout period of the organic photodiode, turn on the silicon reset transistor to reset the first floating diffusion node,
after resetting the first floating diffusion node, turn off the silicon reset transistor and turn on the conversion gain transistor to generate and output an image signal corresponding to an amount of charges generated by the organic photodiode and accumulated in the first floating diffusion node and the second floating diffusion node as the pixel signal,
after outputting the image signal, turn on the organic reset transistor to reset the first floating diffusion node and the second floating diffusion node, and
after resetting the first floating diffusion node and the second floating diffusion node, turn off the organic reset transistor, and generate a second reset signal corresponding to a voltage of the reset first floating diffusion node as the pixel signal.

8. The image sensor of claim 1, wherein the pixel signal comprises:
a first pixel signal corresponding to an amount of charges generated by the silicon photodiode and a second pixel signal corresponding to an amount of charges generated by the organic photodiode,
the first pixel signal is generated in a first illuminance range, and
the second pixel signal is generated in a second illuminance range that is at least partially equal to or greater than the first illuminance range.

9. The image sensor of claim 8, wherein each of the plurality of pixels further comprises:
an analog-to-digital converter (ADC) configured to convert the pixel signal into a pixel value which is a digital signal.

10. The image sensor of claim 1, wherein a light receiving area of the silicon photodiode is greater than or about equal to a light receiving area of the organic photodiode.

11. The image sensor of claim 1, wherein the pixel array comprises:
deep trench isolations (DTIs) formed between silicon photodiodes included in the plurality of pixels, wherein the organic photodiode is located at a point where the DTIs intersect.

12. The image sensor of claim 1, wherein the silicon photodiode is configured to sense light in a visible ray region, and
the organic photodiode is configured to sense at least one of light in the visible ray region and light in a region having a longer wavelength than a wavelength of the light in the visible ray region.

13. An image sensor comprising a pixel array in which a plurality of pixels are arranged,
wherein each of the plurality of pixels comprises:
an organic photodiode of which a sensitivity is adjusted based on an external voltage;
a silicon photodiode;
a first floating diffusion node in which charges generated by the silicon photodiode are accumulated;
a second floating diffusion node in which charges generated by the organic photodiode are accumulated;
an organic reset transistor configured to reset the second floating diffusion node based on a reset voltage applied from outside a pixel;

a silicon transfer transistor configured to transfer charges generated by the silicon photodiode to the first floating diffusion node;

an organic transfer transistor configured to transfer charges generated by the organic photodiode to the second floating diffusion node; and a driving transistor configured to generate a pixel signal corresponding to a voltage of the first floating diffusion node.

14. The image sensor of claim 13, further comprising:

a conversion gain transistor configured to control a connection of the first floating diffusion node and the second floating diffusion node, wherein the image sensor is configured to, in a readout period of the silicon photodiode, turn on the organic reset transistor and the conversion gain transistor to reset the first floating diffusion node and the second floating diffusion node, after resetting the first floating diffusion node and the second floating diffusion node, turn off the organic reset transistor and the conversion gain transistor, and generate and output a first reset signal corresponding to a voltage of the reset first floating diffusion node as the pixel signal, and after outputting the first reset signal, turn on the silicon transfer transistor to generate an image signal corresponding to an amount of charges generated by the silicon photodiode and accumulated in the first floating diffusion node as the pixel signal.

15. The image sensor of claim 13, further comprising:

a conversion gain transistor configured to control a connection of the first floating diffusion node and the second floating diffusion node, wherein the image sensor is configured to, in a readout period of the organic photodiode, turn on the organic reset transistor and the conversion gain transistor to reset the first floating diffusion node and the second floating diffusion node, after resetting the first floating diffusion node and the second floating diffusion node, turn off the organic reset transistor, and generate and output a second reset signal corresponding to voltages of the reset first floating diffusion node and second floating diffusion node as the pixel signal, and after outputting the second reset signal, turn on the organic transfer transistor to generate an image signal corresponding to an amount of charges generated by the organic photodiode and accumulated in the second floating diffusion node as the pixel signal.

16. The image sensor of claim 13, wherein each of the plurality of pixels further comprises:

an analog-to-digital converter (ADC) configured to convert the pixel signal into a pixel value which is a digital signal, wherein the ADC is further configured to generate the pixel value based on a comparison of a ramp signal having a falling inclination and the pixel signal.

17. An image sensor comprising a pixel array in which a plurality of pixels are arranged, wherein each of the plurality of pixels comprises:

an organic photodiode of which a sensitivity is adjusted based on an external voltage;

a silicon photodiode;

a first floating diffusion node in which charges generated by the silicon photodiode are accumulated;

a second floating diffusion node in which charges generated by the organic photodiode are accumulated;

an organic reset transistor configured to reset the second floating diffusion node based on a reset voltage applied from outside a pixel;

a silicon transfer transistor configured to transfer charges generated by the silicon photodiode to the first floating diffusion node;

a silicon reset transistor configured to reset the first floating diffusion node based on the reset voltage; and a driving transistor configured to generate a pixel signal corresponding to a voltage of the first floating diffusion node.

18. The image sensor of claim 17, further comprising:

a conversion gain transistor configured to control a connection of the first floating diffusion node and the second floating diffusion node, wherein the image sensor is configured to, in a readout period of the silicon photodiode, turn on the silicon reset transistor to reset the first floating diffusion node, after resetting the first floating diffusion node, turn off the silicon reset transistor, and generate and output a first reset signal corresponding to a voltage of the reset first floating diffusion node as the pixel signal, after outputting the first reset signal, turn on the silicon transfer transistor to generate an image signal corresponding to an amount of charges generated by the silicon photodiode and accumulated in the first floating diffusion node as the pixel signal.

19. The image sensor of claim 17, further comprising:

a conversion gain transistor configured to control a connection of the first floating diffusion node and the second floating diffusion node, wherein the image sensor is configured to, in a readout period of the organic photodiode, turn on silicon reset transistor to reset the first floating diffusion node, after resetting the first floating diffusion node, turn off the silicon reset transistor and turn on the conversion gain transistor to generate and output an image signal corresponding to an amount of charges generated by the organic photodiode and accumulated in the first floating diffusion node and the second floating diffusion node as the pixel signal, after outputting the image signal, turn on the organic reset transistor to reset the first floating diffusion node and the second floating diffusion node, and after resetting the first floating diffusion node and the second floating diffusion node, turn off the organic reset transistor, and generate a second reset signal corresponding to a voltage of the reset first floating diffusion node as the pixel signal.

20. The image sensor of claim 17, wherein each of the plurality of pixels further comprises:

an analog-to-digital converter (ADC) configured to convert the pixel signal into a pixel value which is a digital signal, wherein the ADC is further configured to generate the pixel value based on a comparison of a ramp signal having a rising inclination and the pixel signal.

* * * * *